(12) United States Patent
Ushikura et al.

(10) Patent No.: US 8,981,375 B2
(45) Date of Patent: Mar. 17, 2015

(54) TRANSISTOR, DISPLAY, AND ELECTRONIC APPARATUS

(71) Applicant: Sony Corporation, Toyko (JP)

(72) Inventors: Shinichi Ushikura, Kanagawa (JP);
Akihiro Nomoto, Kanagawa (JP);
Ryouichi Yasuda, Kanagawa (JP);
Akira Yumoto, Kanagawa (JP);
Nobuhide Yoneya, Kanagawa (JP);
Shimpei Tsujikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 13/678,580

(22) Filed: Nov. 16, 2012

(65) Prior Publication Data
US 2013/0134427 A1    May 30, 2013

(30) Foreign Application Priority Data

Nov. 25, 2011  (JP) ................................. 2011-257438
Feb. 24, 2012  (JP) ................................. 2012-038230

(51) Int. Cl.

| | | |
|---|---|---|
| H01L 29/04 | (2006.01) | |
| H01L 29/10 | (2006.01) | |
| H01L 31/00 | (2006.01) | |
| H01L 33/00 | (2010.01) | |
| H01L 29/786 | (2006.01) | |
| H01L 51/10 | (2006.01) | |
| H01L 51/05 | (2006.01) | |

(52) U.S. Cl.
CPC .......... *H01L 33/0041* (2013.01); *H01L 29/786* (2013.01); *H01L 51/105* (2013.01); *H01L 51/0545* (2013.01)

USPC ........................................................... 257/59

(58) Field of Classification Search
USPC ................. 257/223, 227, 291, 292, 439, 443,
257/E27.1, E27.112, E27.117, E29.145,
257/E29.147, E29.151, E29.182, E29.202,
257/E29.273–E29.299, E29.314, E29.32,
257/E23.016, 40, 59, 57
See application file for complete search history.

(56) References Cited

U.S. PATENT DOCUMENTS

| 7,355,198 B2* | 4/2008 | Suh et al. ......................... 257/40 |
|---|---|---|
| 2001/0023105 A1* | 9/2001 | Yamazaki ..................... 438/289 |
| 2009/0152652 A1* | 6/2009 | Nishi et al. ..................... 257/412 |
| 2010/0208156 A1* | 8/2010 | Liu ................................ 349/46 |
| 2010/0219402 A1* | 9/2010 | Katsuhara et al. ................ 257/40 |
| 2011/0012119 A1* | 1/2011 | Yamazaki et al. ............... 257/59 |
| 2013/0010247 A1* | 1/2013 | Wei et al. ....................... 349/139 |

OTHER PUBLICATIONS

Akamatsu, et al.; "A 13-inch Flexible Color EPD Driven by Low-Temperature a-Si TFTs"; SID 11 Digest; (2011); 198-201.

(Continued)

*Primary Examiner* — Dao H Nguyen
*Assistant Examiner* — Tram H Nguyen
(74) *Attorney, Agent, or Firm* — Wolf, Greenfield & Sacks, P.C.

(57) ABSTRACT

A transistor includes: a gate electrode; a semiconductor layer facing the gate electrode with an insulating layer in between; a pair of source-drain electrodes electrically connected to the semiconductor layer; and a contact layer provided in a moving path of carriers between each of the pair of source-drain electrodes and the semiconductor layer, the contact layer having end surfaces covered with the source-drain electrode.

6 Claims, 23 Drawing Sheets

(56) References Cited

OTHER PUBLICATIONS

Chu, et al.; "High-performance organic thin-film transistors with metal oxide/metal bilayer electrode"; Applied Physics Letters; (2005); 87: 193508-1-193508-3.

Kuo and Jackson; "Direct lithographic top contacts for pentacene organic thin-film transistors"; Applied Physics Letters; (2009); 94: 053304-1-053304-3.

* cited by examiner

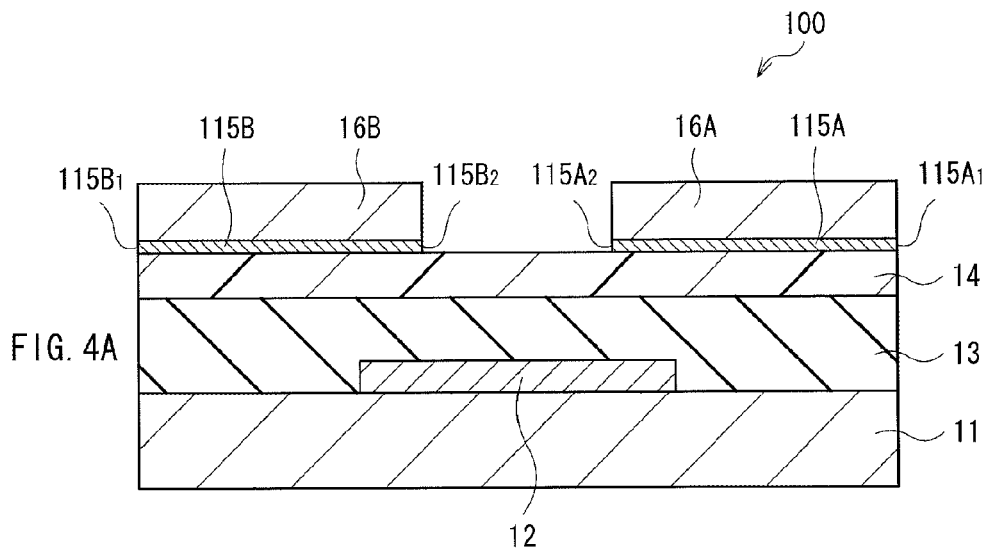
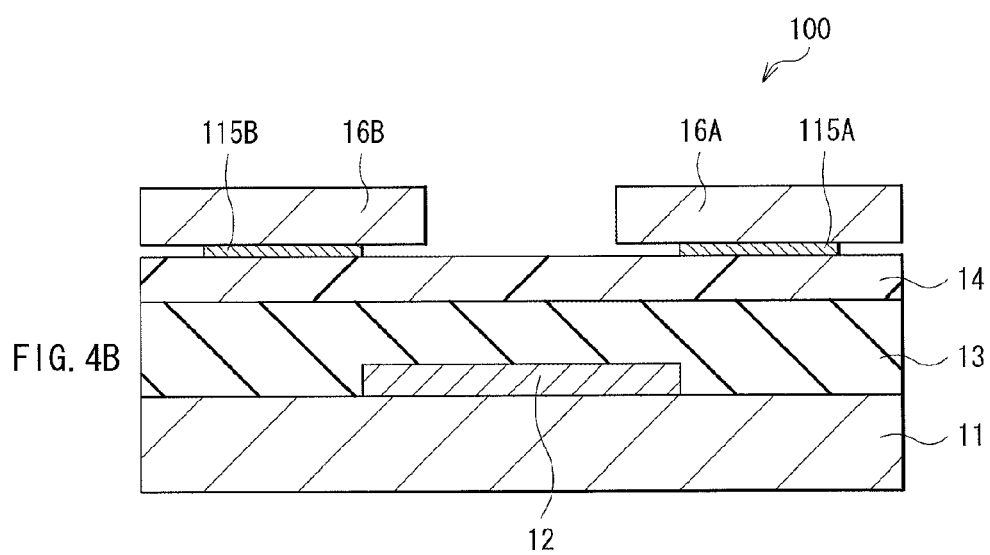

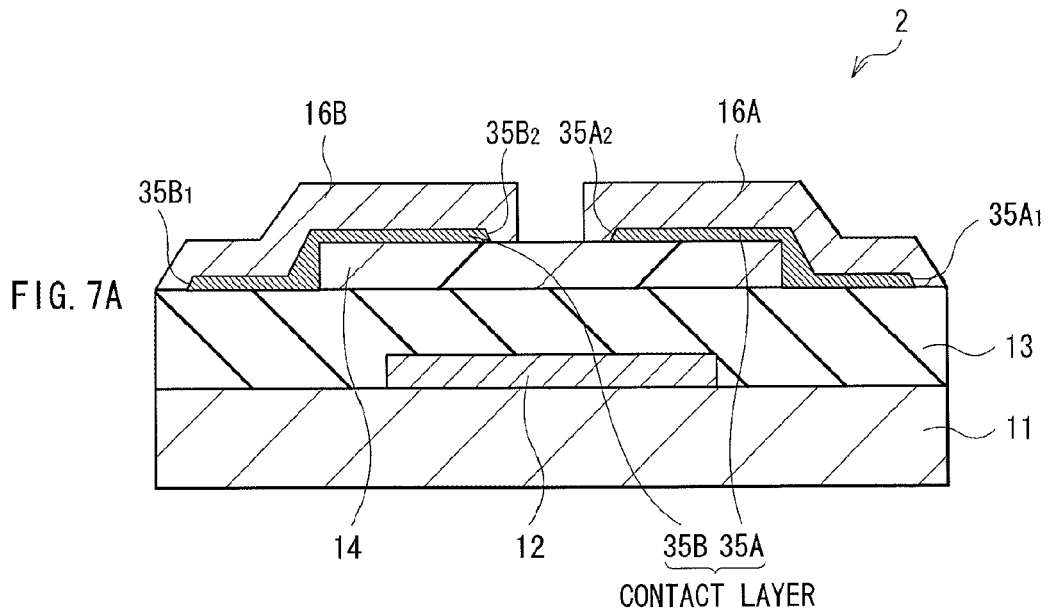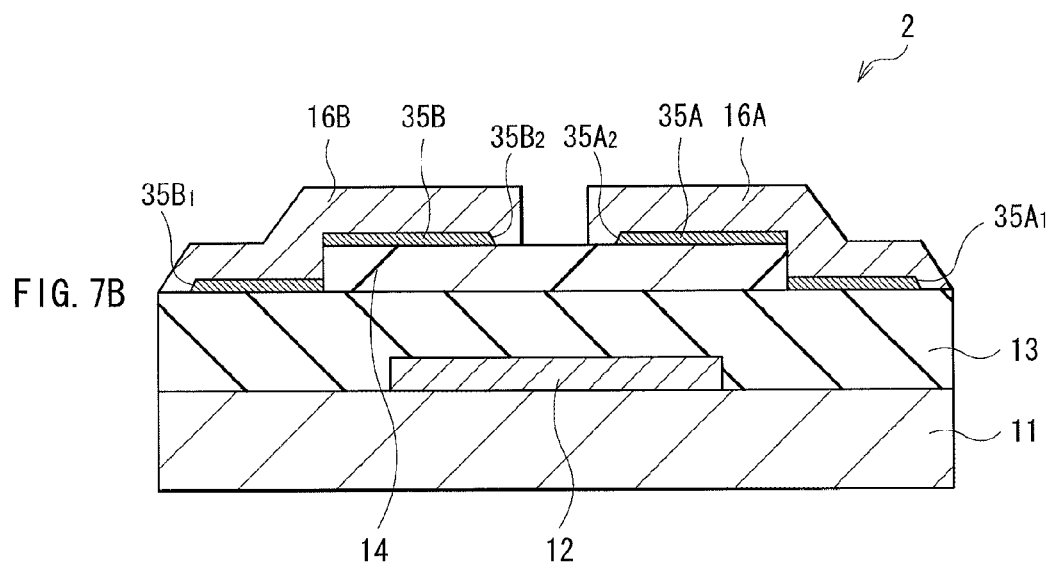

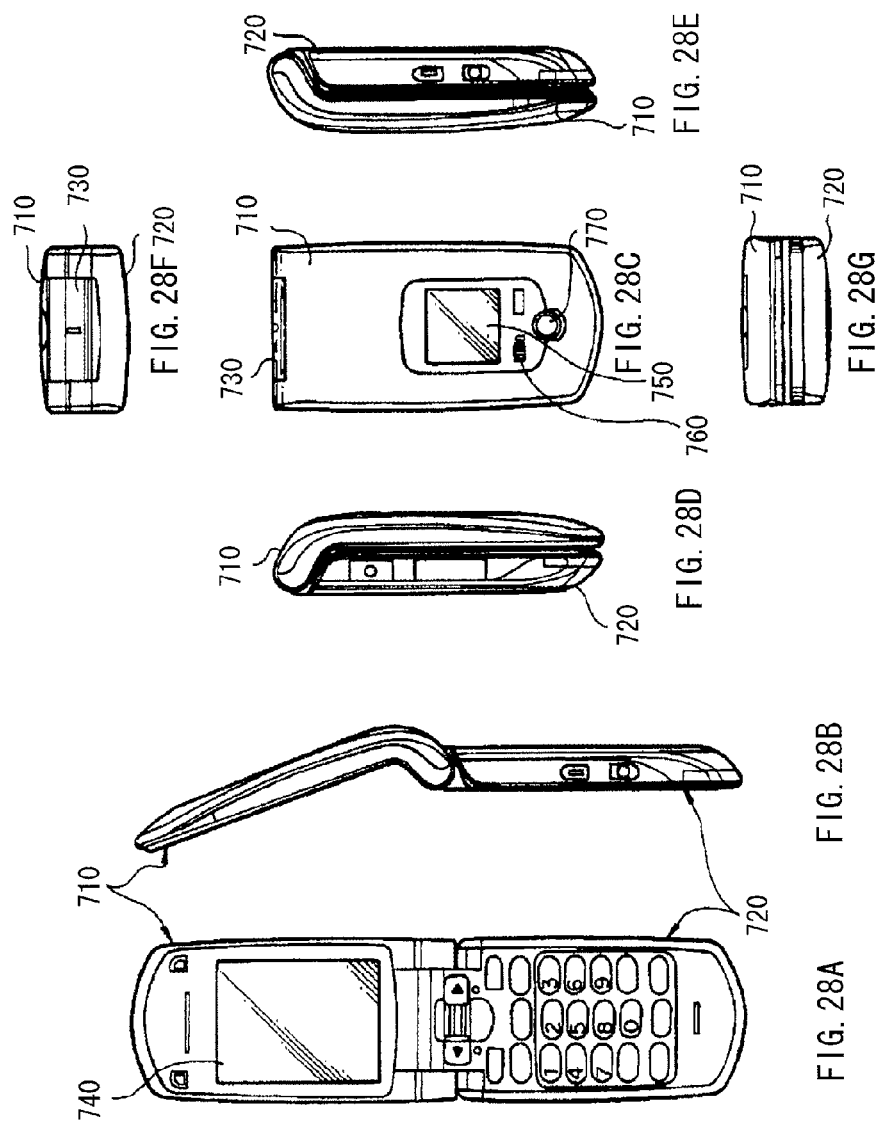

TRANSISTOR, DISPLAY, AND ELECTRONIC APPARATUS

BACKGROUND

This technology relates to a transistor, a display, and an electronic apparatus which are suitable for a case where a semiconductor layer is formed of an organic semiconductor material.

In particular, the technology relates to a display and an electronic apparatus which are provided with electrodes such as pixel electrodes on an upper side of a thin film transistor (TFT).

A thin film transistor (TFT) is used as a driving device for a large number of electronic apparatuses such as displays. Such a TFT includes a gate electrode, a gate insulating layer, a semiconductor layer, and source-drain electrodes which are provided on a substrate. The semiconductor layer of the TFT is formed of an inorganic material or an organic material. The semiconductor layer formed of an organic material (an organic semiconductor layer) is expected to provide advantageous in terms of cost, flexibility, and the like, and is being developed (for example, APPLIED PHYSICS LETTERS, 2005, 87, 193508 and APPLIED PHYSICS LETTERS, 2009, 94, 055304).

An active matrix display (for example, SID 11 DIGEST P198 (2011), K. Akamatsu, et al.) includes a TFT, an interlayer insulating film, pixel electrodes, a display layer, and a common electrode in this order on a substrate. So far, an inorganic semiconductor material such as amorphous silicon (α-Si) is used for a semiconductor film of the TFT. In recent years, however, an organic TFT using an organic semiconductor material is being developed actively.

SUMMARY

Such a TFT using an organic semiconductor layer is desirably manufactured with less defects and improved efficiency.

It is desirable to provide a transistor, a display, and an electronic apparatus which are manufactured with a high yield.

In addition, a TFT used for a display is desirably driven by lower power. In a field of an inorganic TFT, although technology suppressing a drive voltage has been studied, it is difficult to use the technology of the inorganic TFT to an organic TFT. In particular, TFT characteristics of an organic TFT are desirably improved.

It is also desirable to provide a display capable of being driven by lower power, and an electronic apparatuses provided with the display.

According to an embodiment of the technology, there is provided a transistor including: a gate electrode; a semiconductor layer facing the gate electrode with an insulating layer in between; a pair of source-drain electrodes electrically connected to the semiconductor layer; and a contact layer provided in a moving path of carriers between each of the pair of source-drain electrodes and the semiconductor layer, the contact layer having end surfaces covered with the source-drain electrode.

According to an embodiment of the technology, there is provided a first display including a plurality of pixels and a transistor driving the plurality of pixels. The transistor includes: a gate electrode; a semiconductor layer facing the gate electrode with an insulating layer in between; a pair of source-drain electrodes electrically connected to the semiconductor layer; and a contact layer provided in a moving path of carriers between each of the pair of source-drain electrodes and the semiconductor layer, the contact layer having end surfaces covered with the source-drain electrode.

According to an embodiment of the technology, there is provided a first electronic apparatus with a display. The display includes a plurality of pixels and a transistor driving the plurality of pixels. The transistor includes: a gate electrode; a semiconductor layer facing the gate electrode with an insulating layer in between; a pair of source-drain electrodes electrically connected to the semiconductor layer; and a contact layer provided in a moving path of carriers between each of the pair of source-drain electrodes and the semiconductor layer, the contact layer having end surfaces covered with the source-drain electrode.

In the transistor, the first display, and the first electronic apparatus according to the embodiments of the technology, the end surfaces of the contact layer are covered with the source-drain electrodes. Therefore, the contact layer is protected in manufacturing processes subsequent to a formation process of the source-drain electrodes.

According to an embodiment of the technology, there is provided a second display including: a transistor including a semiconductor film, the semiconductor film including a channel region; and a electrode electrically connected to the transistor and covering the channel region. One or more pairs of sides facing each other of sides configuring a planar shape of the channel region are located to face the electrode, inside a planar region of the electrode.

According to an embodiment of the technology, there is provided a second electronic apparatus with a display. The display includes: a transistor including a semiconductor film, the semiconductor film including a channel region; and a electrode electrically connected to the transistor and covering the channel region. One or more pairs of sides facing each other of sides configuring a planar shape of the channel region are located to face the electrode, inside a planar region of the electrode.

In the second display and the second electronic apparatus according to the embodiments of the technology, at least the pair of sides facing each other of the channel region is located to face the electrode, inside a planar region of the electrode. Therefore, the channel region is disposed in a position closer to a center portion of the electrode.

In the transistor, the first display, and the first electronic apparatus according to the embodiments of the technology, the end surfaces of the contact layer are covered with the source-drain electrodes. Therefore, the contact layer is prevented from being damaged in a manufacturing process. Consequently, manufacturing failure caused by the damage of the contact layer is suppressed, and thus yield is allowed to be improved.

In the second display and the second electronic apparatus according to the embodiments of the technology, at least the pair of sides facing each other of the channel region is located to face the electrode, inside the planar region of the electrode. Therefore, isotropy of the channel region is improved. As a result, it is possible to improve TFT characteristics and save consumed power.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 4A and 4B are sectional diagrams each illustrating a structure of a transistor according to a comparative example.

FIGS. 7A and 7B are sectional diagrams each illustrating a structure of a transistor according to a second embodiment of the disclosure.

FIG. 28A is a front view of an application example 6 in an open state, FIG. 28B is a side view thereof, FIG. 28C is a front view in a closed state, FIG. 28D is a left side view, FIG. 28E is a right side view, FIG. 28F is a top view, and FIG. 28G is a bottom view.

DETAILED DESCRIPTION

Hereinafter, preferred embodiments of the technology will be described in detail with reference to drawings. Note that descriptions will be given in the following order.

1. First embodiment (an example of a contact layer in a continuous state)
2. Modification 1 (an example of a contact layer in a discontinuous state)
3. Second embodiment (an example of a contact layer extending in a continuous state)
4. Modification 2 (an example of a contact layer extending in a discontinuous state)
5. Third embodiment (an example in which all sides of a channel region are located to face a pixel electrode, inside a planar region of the pixel electrode)
6. Modification 3 (an example in which a retention capacity is provided in each of regions facing each other with a channel region in between)

[1. First Embodiment]

Figure 1A:
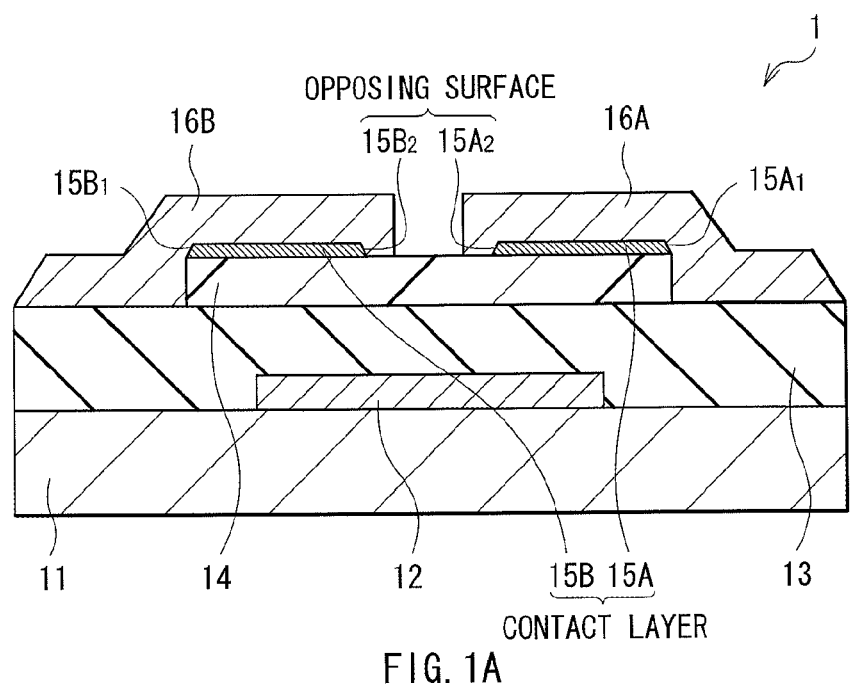
FIG. 1A is a sectional diagram illustrating a structure of a transistor according to a first embodiment of the disclosure.

FIG. 1A illustrates a cross-sectional structure of a transistor (a transistor 1) according to a first embodiment of the disclosure. The transistor 1 is a field-effect transistor using an organic semiconductor material for a semiconductor layer, that is, an organic TFT. The transistor 1 is used as a driving device of a display using a liquid crystal, an organic electroluminescence (EL), or an electrophoretic display element. The transistor 1 is a so-called top-contact bottom-gate TFT, and includes a gate electrode 12, a gate insulating layer 13 (an insulating layer), an organic semiconductor layer 14 (a semiconductor layer), contact layers 15A and 15B, and source-drain electrodes 16A and 16B in this order on a substrate 11.

The substrate 11 supports the gate electrode 12 and the like, and a surface of the substrate 11 (a surface on the gate electrode 12 side) has an insulation property. The substrate 11 is configured using a plastic substrate formed of, for example, polyether sulfone (PES), polyethylene naphthalate (PEN), polyethylene terephthalate (PET), polycarbonate (PC), and polyimide (PI). As the substrate 11, a substrate configured by laminating a surface of a metal foil such as stainless steel (SUS) with resin may be used, or a glass substrate may be used. To obtain high flexibility, a plastic substrate or a metal foil is preferably used.

The gate electrode 12 has a function of applying a gate voltage to the transistor 1, and controlling a carrier density in the organic semiconductor layer 14 using the gate voltage. The gate electrode 12 is provided in a selective region on the substrate 11, and is formed of a single metal such as gold (Au), aluminum (Al), silver (Ag), copper (Cu), platinum (Pt), and nickel (Ni), or an alloy thereof. The gate electrode 12 may be a layered body containing titanium (Ti) and chromium (Cr). Such a layered structure enables improvement in adhesiveness to the substrate 11 or a process resist. The gate electrode 12 may be formed of other inorganic conductive materials, organic conductive materials, or carbon materials.

The gate insulating layer 13 is provided between the gate electrode 12 and the organic semiconductor layer 14 to insulate the gate electrode 12 from the organic semiconductor layer 14 electrically connected to the source-drain electrodes 16A and 16B. The gate insulating layer 13 is configured using an organic insulating film formed of, for example, polyvinyl phenol (PVP), polymethyl methacrylate (PMMA), polyvinyl alcohol (PVA), and polyimide (PI). The gate insulating layer 13 may be configured using an inorganic insulating film formed of silicon oxide ($SiO_2$), aluminum oxide ($Al_2O_3$), tantalum oxide ($Ta_2O_5$), silicon nitride (SiNx), or the like.

The organic semiconductor layer 14 is provided, in an island shape on the gate insulating layer 13, to face the gate electrode 12, and forms a channel through application of the gate voltage. The organic semiconductor layer 14 may be formed of a p-type organic semiconductor material or an n-type organic semiconductor material. Examples of the p-type organic semiconductor material include pentacene, anthracene, phthalocyanine, porphyrin, thiophen-based polymer, and derivatives thereof. Examples of the n-type organic semiconductor material include fullerene, perfluoropentacene, poly(benzobisimidazobenzophenanthroline), and derivatives thereof.

The contact layers 15A and 15B (a first contact layer and a second contact layer) are provided to face each other on the organic semiconductor layer 14 with a distance therebetween. The contact layers 15A and 15B are provided between the organic semiconductor layer 14 and the source-drain electrodes 16A and 16B, namely, in a moving path of carriers, to suppress contact resistance between the source-drain electrodes 16A and 16B and the organic semiconductor layer 14.

In the first embodiment, an end surface $15A_1$ of the contact layer 15A and an end surface $15B_1$ of the contact layer 15B (surfaces opposite to end surfaces facing each other, of the contact layers 15A and 15B) are covered with the source-drain electrodes 16A and 16B, respectively. Therefore, the contact layers 15A and 15B are protected in processes subsequent to a formation process of the source-drain electrodes 16A and 16B. In addition, since the end surfaces facing each other (surfaces $15A_2$ and $15B_2$ facing each other) of the contact layers 15A and 15B are also covered with the source-drain electrodes 16A and 16B, respectively, the contact layers 15A and 15B are more surely protected.

Each of the contact layers 15A and 15B is a film continuously formed from the respective surfaces $15A_2$ and $15B_2$ to the respective end surfaces $15A_1$ and $15B_1$. The end surfaces $15A_1$ and $15B_1$ of the contact layers 15A and 15B substantially coincide with the end surfaces of the organic semiconductor layer 14, and the contact layers 15A and 15B are provided only on the organic semiconductor layer 14.

Each of the contact layers 15A and 15B is formed of a material such as oxides, halides, sulfides, carbonates, organic molecules, complexes, conductive polymers, and the like, which are selected depending on a conductivity type and the HOMO level of the organic semiconductor layer 14. When the organic semiconductor layer 14 is formed of, for example, a p-type organic semiconductor material, the contact layers 15A and 15B may be formed of: metal oxides such as $MoO_3$, $ReO_3$, $V_2O_5$, $WO_3$, $TiO_2$, AuO, $Al_2O_3$, and CuO; oxides such as $SO_3$; metal halides such as CuI, $SbCl_5$, $SbF_5$, $FeCl_3$, LiF, $BaF_2$, $CaF_2$, and $MgF_2$; metal sulfide such as $Cu_2S$; halides such as $AsF_5$, $BF_3$, $BCl_3$, $BBr_3$, and $PF_5$; metal carbonate such as $CaCO_3$, $BaCO_3$, and $LiCO_3$; p-benzoquinones such as 2,3,5,6-tetracyano-(p-cyanyl), 2,3-dibromo-5,6-dicyano-p-benzoquinone, 2,3-dichloro-5,6-dicyano-p-benzoquinone, 2,3-diiodo-5,6-dicyano-p-benzoquinone, 2,3-dicyano-p-benzoquinone, p-bromanil, p-chloranil, p-iodanil, p-fluoranil, 2,5-dichloro-p-benzoquinone, 2,6-dichloro-p-benzoquinone, chloranilic acid, bromanilic acid, 2,5-dihydroxy-p-benzoquinone, 2,5-dichloro-3,6-dimethyl-p-benzoquinone, 2,5-dibromo-3,6-dimethyl-p-benzoquinone, BTDAQ, p-benzoquinone, 2,5-dimethyl-p-benzoquinone, 2,6-dimethyl-p-benzoquinone, duro-(tetramethyl), o-benzoquinones, o-bromanil, o-chloranil, 1,4-naphthoquinones, 2,3-dicyano-5-nitro-1,4-naphthoquinone, 2,3-dicyano-1,4-naphthoquinone, 2,3-dichloro-5-nitro-1,4-naphthoquinone, 2,3-dichloro-1,4-naphthoquinone, and 1,4-naphthoquinone; diphenoquinones such as 3,3',5,5'-tetrabromo-diphenoquinone, 3,3',5,5'-tetrachloro-diphenoquinone, and diphenoquinone; TCNQs such as tetracyano-quinodimethane (TCNQ), tetrafluoro-tetracyano-quinodimethane (F4-TCNQ), trifluoromethyl-TCNQ, 2,5-difluoro-TCNQ, monofluoro-TCNQ, TNAP, decyl-TCNQ, methyl-TCNQ, dihydrobarreleno-TCNQ, tetrahydrobarreleno-TCNQ, dimethyl-TCNQ, diethyl-TCNQ, benzo-TCNQ, dimethoxy-TCNQ, BTDA-TCNQ, diethoxy-TCNQ, tetramethyl-TCNQ, tetracyanoanthraquinodimethane, polynitro compound, tetranitrobiphenol, dinitrobiphenyl, picric acid, trinitrobenzene, 2,6-dinitrophenol, and 2,4-dinitrophenol, and analogs thereof; fluorenes such as 9-dicyanomethylene-2,4,5,7-tetranitro-fluoren, 9-dicyanomethylene-2,4,7-trinitro-fluorene, 2,4,5,7-tetoranitro-fluorenone, and 2,4,7-trinitro-fluorenone; benzocyanos such as $(TBA)_2HCTMM$, $(TBA)_2HCDAHD$, K·CF, TBA·PCA, TBA·MeOTCA, TBA·EtOTCA, TBA·PrOTCA, $(TBA)_2HCP$, hexacyanobutadiene-tetracyanoethylene, and 1,2,4,5-tetracyanobenzene, and analogs thereof; transition metal complexes such as $(TPP)_2Pd(dto)_2$, $(TPP)_2Pt(dto)_2$, $(TPP)_2Ni(dto)_2$, $(TPP)_2Cu(dto)_2$, and $(TBA)_2Cu(ox)_2$; conductive polymers such as PEDOT/PSS and polyaniline; and the like.

When the organic semiconductor layer 14 is formed of, for example, an n-type organic semiconductor material, the contact layers 15A and 15B may be formed of: metals such as Li and Cs; metal carbonate such as $Cs_2CO_3$ and $Rb_2CO_3$; aromatic hydrocarbon such as tetracene, perylene, anthracene, coronene, pentacene, chrysene, phenanthrene, naphthalene, p-dimethoxybenzene, rubrene, and hexamethoxytriphenylene, and analogs thereof; TTFs such as HMTTF, OMTTF, TMTTF, BEDO-TTF, TTeCn-TTF, TMTSF, EDO-TTF, HMTSF, TTF, EOET-TTF, EDT-TTF, $(EDO)_2DBTTF$, TSCn-TTF, HMTTeF, BEDT-TTF, CnTET-TTF, TTCn-TTF, TSF, and DBTTF, and analogs thereof; TTTs such as tetrathiotetracene, tetraselenotetracene, and tetratellurotetracene; azines such as dibenzo[c,d]-phenothiazine, benzo[c]-phenothiazine, phenothiazine, N-methyl-phenothiazine, dibenzo[c,d]-phenoselenazine, N,N-dimethylphenazine, and phenazine; monoamines such as N,N-diethyl-m-toluidine, N,N-diethylaniline, N-ethyl-o-toluidine, diphenylamine, skatole, indole, N,N-dimethyl-o-toluidine, o-toluidine, m-toluidine, aniline, o-chloroaniline, o-bromoaniline, and p-nitroaniline; diamines such as N,N,N',N'-tetramethyl-p-phenylenediamine, 2,3,5,6-tetramethyl-(durenediamine), p-phenyldiamine, N,N,N',N'-tetoramethylbenzidine, 3,3',5,5'-tetoramethylbenzidine, 3,3'-dimethylbenzidine, 3,3'-dimethoxybenzidine, benzidine, 3,3'-dibromo-5,5'-dimethylbenzidine, 3,3'-dichloro-5,5'-dimethylbenzidine, and 1,6-diaminopyrene; 4,4',4"-tris(N-3-methylphenyl-N-phenylamino)-triphenylamine: (m-MTDAT A); 4,4',4"-tris(N-(2-naphtyl)-N-phenylamino)-triphenylamine: (2TNATA); α-NDP; copper phthalocyanine; 1,4,6,8-tetrakisdimethyl aminopyrene; 1,6-dithiopyren; decamethylferrocene; ferrocene; and the like.

Each of the contact layers 15A and 15B formed of the above-described materials has a thickness of, for example, about several nm to about 30 nm. The thin contact layers 15A and 15B thus provided suppress resistance in a vertical direction (a thickness direction).

The source-drain electrodes 16A and 16B are electrically connected to the organic semiconductor layer 14 through the contact layers 15A and 15B, respectively. The respective ends (on respective sides opposite to the portions facing each other, of the source-drain electrodes 16A and 16B) of the source-drain electrodes 16A and 16B are in contact with the gate insulating layer 13 through the end surfaces $15A_1$ and $15A_2$ of the contact layers 15A and 15B and the end surfaces of the organic semiconductor layer 14. The portions facing each other, of the source-drain electrodes 16A and 16B are in contact with the organic semiconductor layer 14 through the respective surfaces $15A_2$ and $15B_2$ facing each other of the contact layers 15A and 15B. In other words, the source-drain electrodes 16A and 16B each have a region directly in contact with the gate insulating layer 13 and a region directly in contact with the organic semiconductor layer 14, thereby suppressing electrode exfoliation of the source-drain electrodes 16A and 16B. In addition, the contact layers 15A and 15B are provided only on the organic semiconductor layer 14 so that the source-drain electrodes 16A and 16B directly in contact with the gate insulating layer 13 with a wide area, and the wiring exfoliation of the source-drain electrodes 16A and 16B is suppressed in a region around the organic semiconductor layer 14.

Each of the source-drain electrodes 16A and 16B is formed of a single metal such as gold, aluminum, silver, copper, platinum, nickel, and indium tin oxide (ITO), or an alloy thereof. Similarly to the gate electrode 12, the source-drain electrodes 16A and 16B may contain titanium or chromium as an upper layer or a lower layer. Such a layered structure enables improvement in adhesiveness to the substrate 11, process resist, or the contact layers 15A and 15B. The source-drain electrodes 16A and 16B may be configured of a patterned conductive ink containing conductive microparticles.

The transistor 1 is manufactured, for example, in the following manner.

Figure 2A:
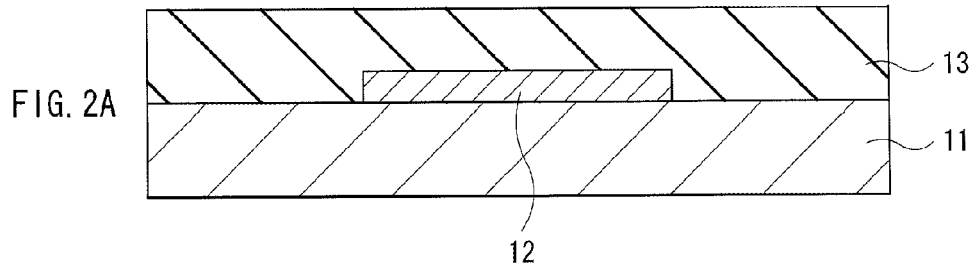
FIGS. 2A and 2B are sectional diagrams illustrating a method of manufacturing the transistor illustrated in FIG. 1A in process order.

First, as illustrated in FIG. 2A, the gate electrode 12 is formed on the substrate 11, and the gate insulating layer 13 is then formed to cover the gate electrode 12. Specifically, first, a conductive film of the gate electrode 12 is formed on an entire surface of the substrate 11 by evaporation, sputtering, or the like, and a pattern of a photoresist is then formed on the conductive film with use of, for example, photolithography. After that, the conductive film is etched and patterned with use of the formed pattern of the photoresist as a mask. As a result, the gate electrode 12 is formed. The gate electrode 12 may be formed by a printing method such as screen printing, gravure printing, and inkjet printing. Subsequently, the gate insulating layer 13 made of an organic insulating material is formed on the entire surface of the substrate 11 with use of a coating method including printing methods such as spin coating, screen printing, gravure printing, and inkjet printing. When the gate insulating layer 13 is formed of an inorganic insulating material, methods such as evaporation, sputtering, and chemical vapor deposition (CVD) may be used.

Figure 2B:
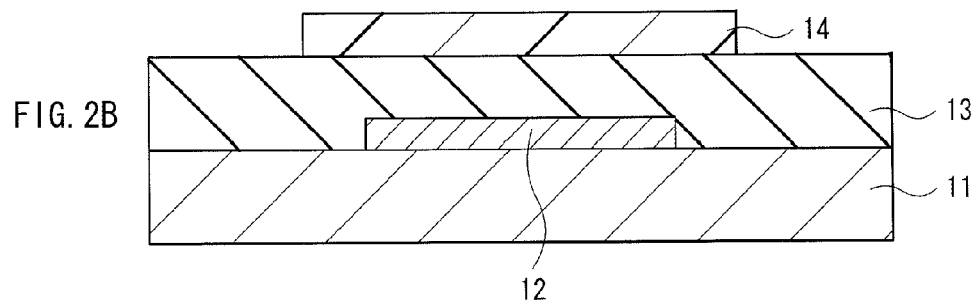

As illustrated in FIG. 2B, after formation of the gate insulating layer 13, the organic semiconductor layer 14 is formed in a position facing the gate electrode 12 on the gate insulating layer 13. The organic semiconductor layer 14 is directly formed in a state of, for example, being patterned by a pattern deposition method using a mask, a printing method, or the like. Alternatively, patterning is performed by a laser ablation method or the like after a film formed of a material of the organic semiconductor layer 14 is formed on the entire surface of the substrate 11 (on the gate insulating film 13). Otherwise, the organic semiconductor layer 14 may be formed by a liftoff method. If device isolation is unnecessary, the organic semiconductor layer 14 may be provided on the entire surface of the substrate 11.

Figure 3A:
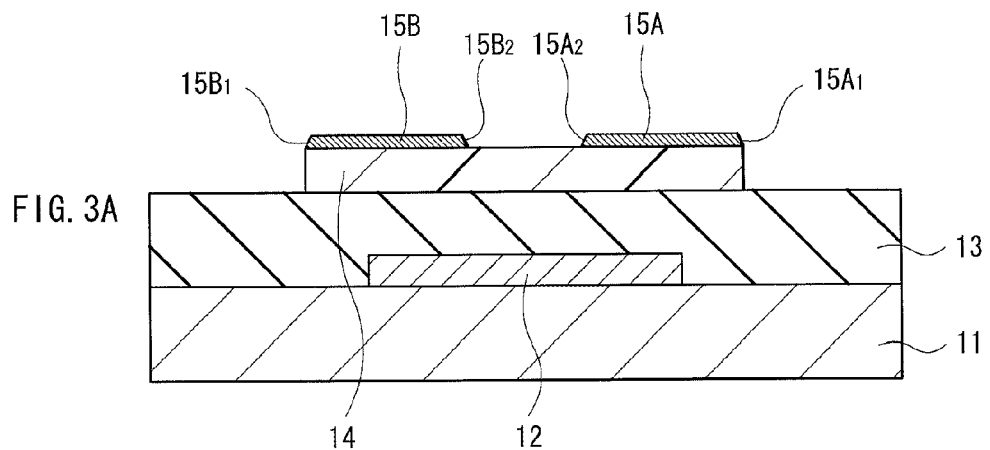
FIGS. 3A and 3B are sectional diagrams illustrating processes following the process of FIG. 2B.

As illustrated in FIG. 3A, after formation of the organic semiconductor layer 14, the contact layers 15A and 15B are formed on the organic semiconductor layer 14. The contact layers 15A and 15B are directly formed in a patterned state by a pattern deposition method with use of a mask or a printing method, for example.

Figure 3B:
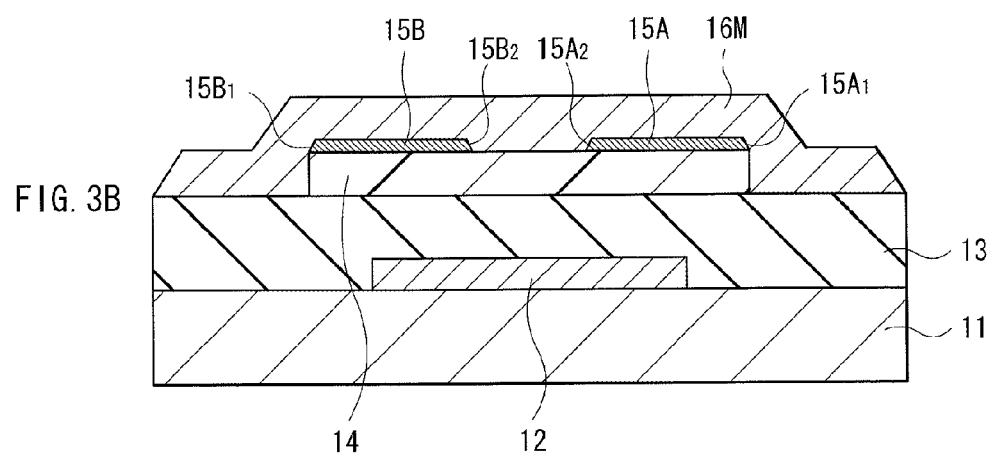

Subsequently, the source-drain electrodes 16A and 16B are formed to cover the contact layers 15A and 15B and the top surface and the end surfaces of the organic semiconductor layer 14. As illustrated in FIG. 3B, the source-drain electrodes 16A and 16B are patterned by, for example, a lithography process, after formation of a metal film 16M on the entire surface of the substrate 11 (on the gate insulating layer 13, the organic semiconductor layer 14, and the contact layers 15A and 15B). Alternatively, the source-drain electrodes 16A and 16B may be directly formed in a patterned state by, for example, a printing method. In this way, the transistor 1 is completed.

When the transistor 1 is integrated, a passivation layer, a planarizing layer, wirings, and the like are formed on the source-drain electrodes 16A and 16B, for example. A connection hole may be provided in the gate insulating layer 13, and the source-drain electrodes 16A and 16B may be connected to electrodes on a layer lower than the gate insulating layer 13 (for example, electrodes in the layer same as that of the gate electrode 12) through the connection hole.

In the first embodiment, since the end surfaces $15A_1$ and $15B_1$ of the contact layers 15A and 15B are covered with the source-drain electrodes 16A and 16B, the contact layers 15A and 15B are protected in processes subsequent to the formation process of the source-drain electrodes 16A and 16B, and yield is accordingly improved. The detail thereof will be described below with reference to a comparative example.

FIG. 4A illustrates a cross-sectional structure of a transistor 100 according to a comparative example. The transistor 100 has a bottom-gate top-contact structure, similarly to the transistor 1. However, in the transistor 100, respective end surfaces $115A_1$ and $115B_1$ of contact layers 115A and 115B coincide with the respective end surfaces of the source-drain electrodes 16A and 16B, and the end surfaces $115A_1$ and $115B_1$ of the contact layers 115A and 115B are exposed. In addition, surfaces $115A_2$ and $115B_2$ facing each other, of the contact layers 115A and 115B coincide with the surfaces facing each other of the source-drain electrodes 16A and 16B, and the surfaces $115A_2$ and $115B_2$ of the contact layers 115A and 115B are also exposed.

As illustrated in FIG. 4B, in such a transistor 100, the end surfaces $115A_1$ and $115B_1$ and the surfaces $115A_2$ and $115B_2$ of the contact layers 115A and 115B may be subjected to unintentional side etching at the time of formation of the source-drain electrodes 16A and 16B or in subsequent processes, and accordingly, electrode exfoliation or contact failure of the source-drain electrodes 16A and 16B may occur. Yield in manufacturing of the transistor 100 is reduced due to the electrode exfoliation and contact failure.

At the time of manufacturing a top-contact type transistor, an aqueous solution or water is commonly used to prevent the organic semiconductor layer from being deteriorated by an organic solvent. However, many of the materials of the contact layer are soluble in water (for example, $MoO_3$, $WO_3$, $V_2O_5$, $FeCl_3$, and PEDOT/PSS). In addition, the contact layer is provided with a small thickness to suppress electrical resistance. Therefore, the contact layer is easily etched by, for example, an alkaline aqueous solution or water which is used in a resist exfoliation process in manufacturing. For example, MoO$_3$ as a material of the contact layer is dissolved in pure water in about three seconds even if it has a thickness of 50 nm.

To manufacture the transistor 100, after formation of the organic semiconductor layer 14 in an island shape, material films of the contact layers 115A and 115B and metal films to be the source-drain electrodes 16A and 16B are successively formed, and patterned at the same time. Specifically, the end surfaces 115A$_1$ and 115B$_1$ and the surfaces 115A$_2$ and 115B$_2$ facing each other of the contact layers 115A and 115B coincide with the end surfaces and the surfaces facing each other, of the source-drain electrodes 16A and 16B, respectively, and the end surfaces 115A$_1$ and 115B$_1$ and the surfaces 115A$_2$ and 115B$_2$ of the contact layers 115A and 115B are exposed. Therefore, the contact layers 115A and 115B may be unintentionally subjected to side etching by an alkaline aqueous solution or water which is used at the time of forming the source-drain electrodes 16A and 16B or in subsequent processes. In particular, when integration or miniaturization of the transistor 100 is performed, the contact layers 115A and 115B are likely to be subjected to side etching.

In addition, in the transistor 100, the contact layers 115A and 115B are provided on the entire lower surface of the source-drain electrodes 16A and 16B, and the source-drain electrodes 16A and 16B do not have a region directly in contact with the organic semiconductor layer 14 and the gate insulating layer 13. Therefore, if adhesiveness between the organic semiconductor layer 14 and the contact layers 115A and 115B, between the contact layers 115A and 115B and the source-drain electrodes 16A and 16B, or between the contact layers 115A and 115B and the gate insulating layer 13 is low, the electrode exfoliation of the source-drain electrodes 16A and 16B may occur.

In contrast, in the first embodiment, the end surfaces 15A$_1$ and 15B$_1$ of the contact layers 15A and 15B are covered with the source-drain electrodes 16A and 16B, respectively, so that the contact layers 15A and 15B are protected from an aqueous solution or water which is used at the time of forming the source-drain electrodes 16A and 16B or at the time of forming upper layers such as a passivation layer. Accordingly, electrode exfoliation and contact failure of the source-drain electrodes 16A and 16B caused by side etching of the contact layers 15A and 15B are suppressed, and thus, yield in manufacturing is allowed to be improved. Moreover, the surfaces 15A$_2$ and 15B$_2$ facing each other of the contact layers 15A and 15B are also covered with the source-drain electrodes 16A and 16B, together with the end surfaces 15A$_1$ and 15B$_1$ of the contact layers 15A and 15B. Therefore, side etching of the contact layers 15A and 15B is more surely prevented.

Furthermore, in the transistor 1, the end portions of the source-drain electrodes 16A and 16B are in contact with the gate insulating layer 13 and the portions facing each other of the source-drain electrodes 16A and 16B are in contact with the organic semiconductor layer 14. Accordingly, the electrode exfoliation of the source-drain electrodes 16A and 16B is suppressed even when the adhesiveness between the contact layers 15A and 15B and the organic semiconductor layer 14, between the contact layers 15A and 15B and the source-drain electrodes 16A and 16B, or between the contact layers 15A and 15B and the gate insulating layer 13 is low.

In addition, since the contact layers 15A and 15B are provided only on the organic semiconductor layer 14, the region in which the gate insulating layer 13 is directly in contact with the source-drain electrodes 16A and 16B is large. Therefore, even when the adhesiveness of the contact layers 15A and 15B is low, the wiring exfoliation of the source-drain electrodes 16A and 16B is prevented. Moreover, when a connection hole is provided in the gate insulating layer 13 and the source-drain electrodes 16A and 16B are connected to electrodes on a layer lower than the gate insulating layer 13 through the connection hole, the contact layer 15A and 15B do not block the connection.

In the transistor 1 of the first embodiment, when a predetermined potential is supplied to the gate electrode 12, an electric field occurs in a channel of the organic semiconductor layer 14, and a current flows between the source-drain electrodes 16A and 16B. In other words, the transistor 1 functions as a so-called field-effect transistor. In this case, since the end surfaces 15A$_1$ and 15B$_1$ of the contact layers 15A and 15B are covered with the source-drain electrodes 16A and 16B, respectively, side etching of the contact layers 15A and 15B is prevented.

As described above, in the first embodiment, the end surfaces 15A$_1$ and 15B$_1$ of the contact layers 15A and 15B are covered with the source-drain electrodes 16A and 16B, respectively. Therefore, the contact layers 15A and 15B are protected from side etching, and electrode exfoliation and contact failure of the source-drain electrodes 16A and 16B are suppressed. As a result, manufacturing failure caused by the side etching of the contact layers 15A and 15B is prevented, and thus, yield is improved. In addition, the surfaces 15A$_2$ and 15B$_2$ facing each other of the contact layers 15A and 15B are also covered with the source-drain electrodes 16A and 16B, respectively, together with the end surfaces 15A$_1$ and 15B$_1$ of the contact layers 15A and 15B. Therefore, side etching of the contact layers 15A and 15B is more surely prevented.

Further, the end portions of the source-drain electrodes 16A and 16B each have a region directly in contact with the gate insulating layer 13, and the surfaces facing each other of the source-drain electrodes 16A and 16B each have a region directly in contact with the organic semiconductor layer 14. Therefore, when the adhesiveness of the contact layers 15A and 15B is low, the electrode exfoliation of the source-drain electrodes 16A and 16B is prevented.

A modification of the first embodiment and other embodiments will be described below while like numerals are used to designate substantially like components of the first embodiment, and the description thereof will be appropriately omitted.

[Modification 1]

Figure 5:
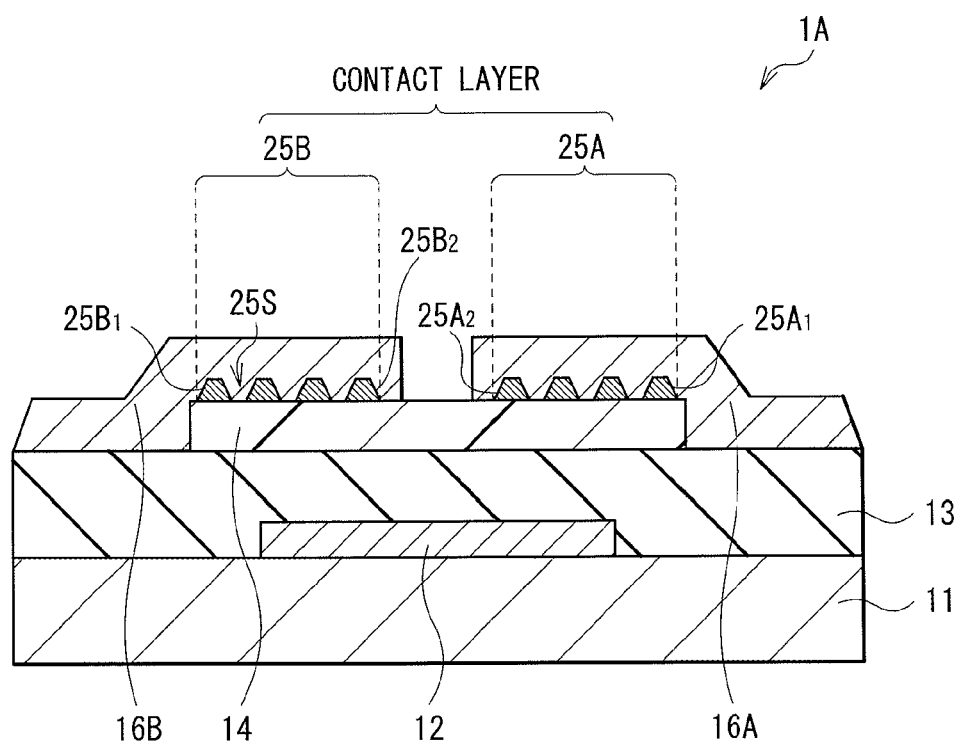
FIG. 5 is a sectional diagram illustrating a structure of a transistor according to a modification 1.

FIG. 5 illustrates a cross-sectional structure of a transistor (a transistor 1A) according to a modification 1 of the first embodiment. The transistor 1A is different from the transistor 1 of the first embodiment in that contact layers 25A and 25B are in a discontinuous state. Except for this point, the transistor 1A has a similar configuration to that of the transistor 1, and also has functions and effects similar to those of the transistor 1.

The contact layers 25A and 25B have a plurality of minute gaps 25S in respective regions from surfaces 25A$_2$ and 25B$_2$ facing each other of the contact layers 25A and 25B to end surfaces 25A$_1$ and 25B$_1$ of the contact layers 25A and 25B, namely, the contact layers 25A and 25B are provided in a discontinuous state. In other words, the contact layers 25A and 25B are scattered in granular state with the gaps 25S in between. Therefore, even in the case where the surfaces 25A$_2$ and 25B$_2$ facing each other of the contact layers 25A and 25B are not covered with the source-drain electrodes 16A and 16B, infiltration of an aqueous solution or water from the surfaces 25A$_2$ and 25B$_2$ are inhibited by the gaps 25S. In other words, portions of the contact layers 25A and 25B to be a moving path of carriers are protected. The size of each of the gaps 25S is, for example, 10 to 100 nm.

The transistor 1A is manufactured, for example, in the following manner.

Figure 6A:
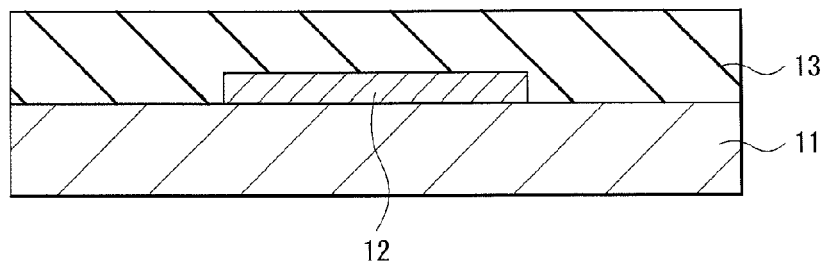
FIGS. 6A to 6C are sectional diagrams illustrating a method of manufacturing the transistor illustrated in FIG. 5 in process order.
Figure 6B:
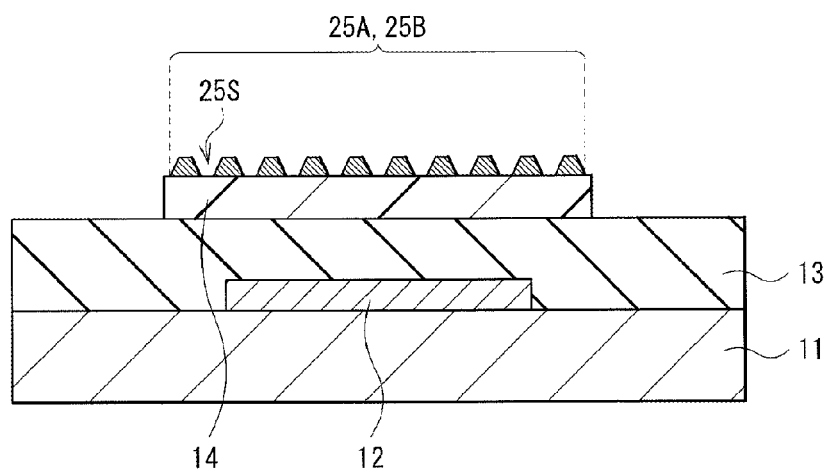

First, as illustrated in FIG. 6A, layers up to the gate insulating layer 13 are formed as the transistor 1. Subsequently, as illustrated in FIG. 6B, the organic semiconductor layer 14 and the contact layers 25A and 25B are formed on the gate insulating layer 13. The organic semiconductor layer 14 and the contact layers 25A and 25B may be successively and directly patterned in this order by a pattern deposition method using a mask or a printing method. Alternatively, a film formed of a material of the organic semiconductor layer 14 on the entire surface of the substrate 11, and the contact layers 25A and 25B in a discontinuous state on the entire surface of the substrate 11 are formed in this order, and then the organic semiconductor layer 14 and the contact layers 25A and 25B are patterned by a laser ablation method or the like at the same time. The organic semiconductor layer 14 and the contact layers 25A and 25B may be formed by a liftoff method. When vacuum film formation is ended by setting rate of vacuum film formation to be low and a film formation time to be short, before the film is developed to a continuous film, the contact layers 25A and 25B in the discontinuous state, namely, the contact layers 25A and 25B having the plurality of gaps 25S are formed. The discontinuous pattern may be directly formed by a pattern deposition method or a printing method.

Figure 6C:
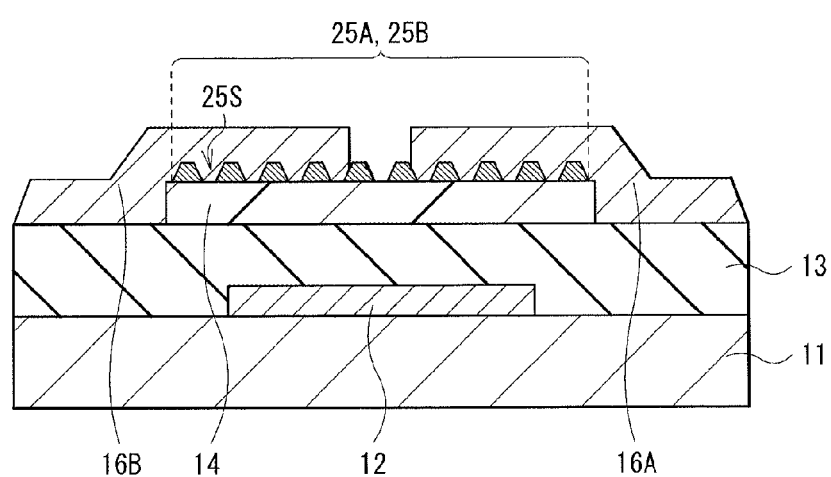

After formation of the contact layers 25A and 25B, the source-drain electrodes 16A and 16B are formed as illustrated in FIG. 6C. The source-drain electrodes 16A and 16B may be patterned by a lithography process after a metal film (for example, the metal film 16M) is formed on the entire surface of the substrate 11. Alternatively, pattern of the source-drain electrodes 16A and 16B may be directly formed by a printing method.

The contact layers 25A and 25B in a gap between the source-drain electrode 16A and the source-drain electrode 16B may be left if an off current is sufficient (FIG. 6C). If the off current is insufficient, the contact layers 25A and 25B in the gap are removed by etching (FIG. 5). At this time, since the contact layers 25A and 25B have the gaps 25S, infiltration of water or an aqueous solution used in the etching is stopped by the gaps 25S, and portions of the contact layers 25A and 25B to be a moving path of carriers (portions of the contact layers 25A and 25B between the source-drain electrodes 16A and 16B and the organic semiconductor layer 14) are not eroded.

[Second Embodiment]

FIG. 7A illustrates a cross-sectional structure of a transistor (a transistor 2) according to a second embodiment of the technology. The transistor 2 is different from the transistor 1 of the first embodiment in that contact layers 35A and 35B each extend on the gate insulating layer 13 through the end surfaces of the organic semiconductor layer 14. Except for this point, the transistor 2 has a configuration similar to that of the transistor 1, and also has functions and effects similar to those of the transistor 1.

Each of the contact layers 35A and 35B is a continuous film, and extends from the top surface of the organic semiconductor layer 14 to on the gate insulating layer 13 through the end surface of the organic semiconductor layer 14. The contact layers 35A and 35B face each other with a distance. A surface $35A_2$ facing a surface $35B_2$ and an end surface $35A_1$ are covered with the source-drain electrode 16A, and the surface $35B_2$ and an end surface $35B_1$ are covered with the source-drain electrode 16B. Each of the contact layers 35A and 35B may be formed continuously from on the organic semiconductor layer 14 to on the gate insulating layer 13 (FIG. 7A), or may be cut in tiers by the organic semiconductor layer 14, namely, may be separated into a portion on the organic semiconductor layer 14 and a portion on the gate insulating layer 13, as illustrated in FIG. 7B.

[Modification 2]

Figure 8:
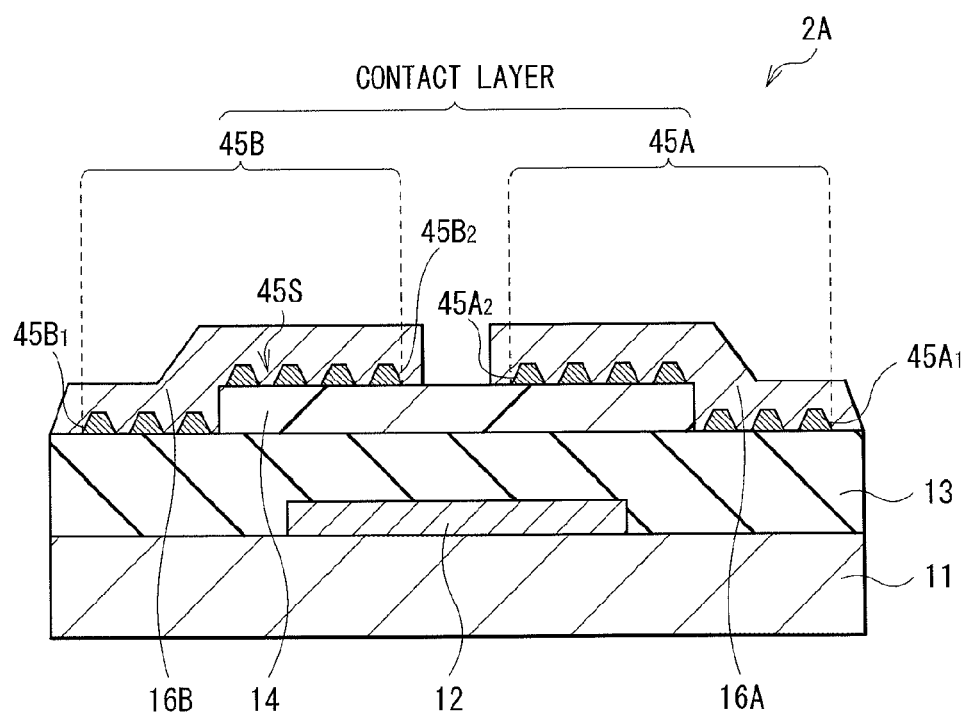
FIG. 8 is a sectional diagram illustrating a structure of a transistor according to a modification 2.

FIG. 8 illustrates a cross-sectional structure of a transistor (a transistor 2A) according to a modification 2. The transistor 2A is different from the transistor 2 of the second embodiment in that contact layers 45A and 45B are in a discontinuous state. Except for this point, the transistor 2A has a configuration similar to that of the transistor 2, and also has functions and effects similar to those of the transistor 2.

The contact layers 45A and 45B have a plurality of minute gaps 45S between respective surfaces $45A_2$ and $45B_2$ facing each other, to respective end surfaces $45A_1$ and $45B_1$, and are provided in a discontinuous state on the top surface of the organic semiconductor layer 14 and on the gate insulating layer 13. The contact layers 45A and 45B face each other with a distance. The surface $45A_2$ and the end surface $45A_1$ are covered with the source-drain electrode 16A, and the surface $45B_2$ and the end surface $45B_1$ are covered with the source-drain electrode 16B. Since each of the contact layers 45A and 45B is a discontinuous layer, even when the surfaces $45A_2$ and $45B_2$ facing each other of the contact layers 45A and 45B are not covered with the source-drain electrodes 16A and 16B, respectively, infiltration of an aqueous solution or water from the surfaces $45A_2$ and $45B_2$ is stopped by the gaps 45S. The contact layers 45A and 45B in a discontinuous state are formed as the contact layers 25A and 25B. When an off current is sufficient, the contact layers 45A and 45B may exist in a gap between the source-drain electrode 16A and the source-drain electrode 16B.

APPLICATION EXAMPLE 1-1

Figure 9:
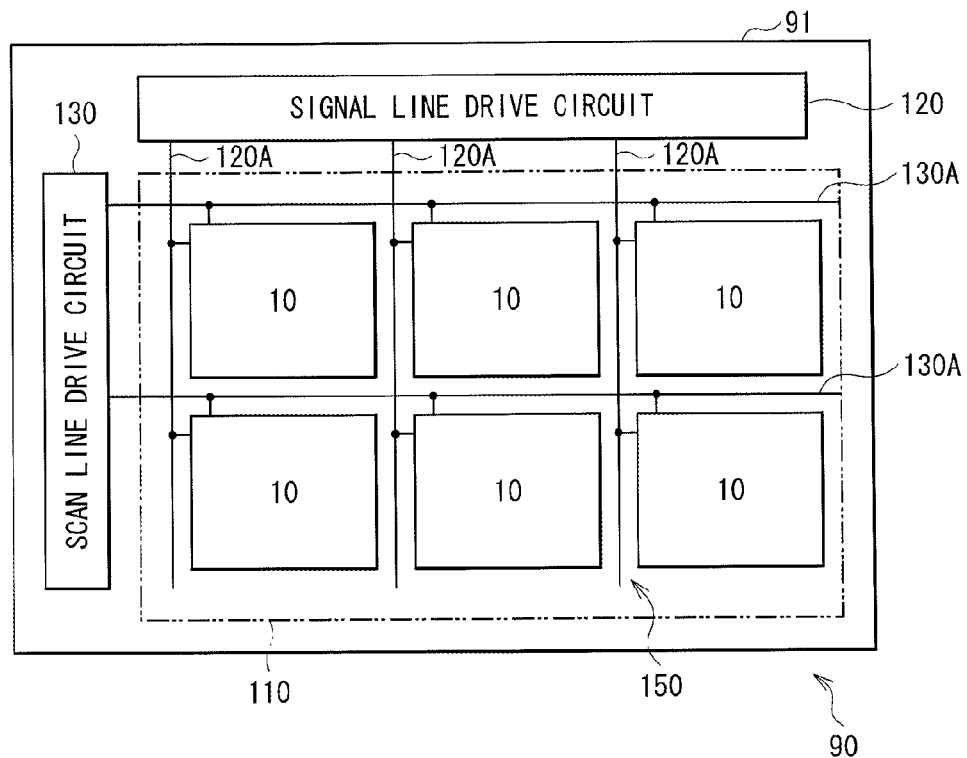
FIG. 9 is a diagram illustrating a circuit configuration of a display according an application example 1-1.

FIG. 9 illustrates a circuit configuration of a display (a display 90) including any of the transistors 1, 1A, 2, and 2A as a driving device. The display 90 is, for example, a liquid crystal display, an organic EL display, or an electronic paper display, and includes a plurality of pixels 10 which is arranged in a matrix in a display region 110 on a drive panel 91, and various kinds of drive circuits driving the pixels 10. As the drive circuits, a signal line drive circuit 120 and a scan line drive circuit 130 which are drivers for image display, and a pixel drive circuit 150 are disposed on the drive panel 91. A sealing panel (not shown) is bonded to the drive panel 91, and the pixels 10 and the drive circuits are sealed by the sealing panel.

Figure 10:
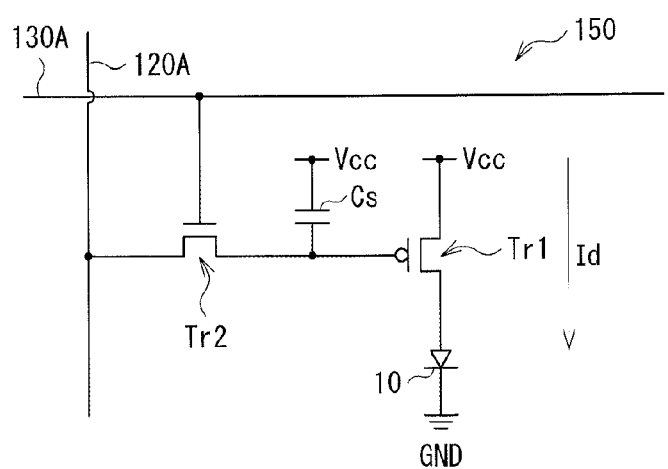
FIG. 10 is an equivalent circuit diagram illustrating an example of a pixel drive circuit illustrated in FIG. 9.

FIG. 10 is an equivalent circuit diagram of the pixel drive circuit 150. The pixel drive circuit 150 is an active drive circuit provided with transistors Tr1 and Tr2 as any of the transistors 1, 1A, 2, and 2A. A capacitor Cs is provided between the transistors Tr1 and Tr2, and the pixel 10 is connected in series with the transistor Tr1 between a first power line (Vcc) and a second power line (GND). In such a pixel drive circuit 150, a plurality of signal lines 120A are arranged in a column direction, and a plurality of scan lines 130A are arranged in a row direction. Each of the signal lines 120A is connected to the signal line drive circuit 120, and a pixel signal is supplied to a source electrode of the transistor Tr2 from the signal line drive circuit 120 through the signal line 120A. Each of the scan lines 130A is connected to the scan line drive circuit 130, and a scan signal is sequentially supplied to a gate electrode of the transistor Tr2 from the scan line drive circuit 130 through the scan line 130A. In the display, the transistors Tr1 and Tr2 are configured of any of the transistors 1, 1A, 2, and 2A of the embodiments. Therefore, high quality display is performed by favorable TFT characteristics of the transistors Tr1 and Tr2. Such a display 90 may be mounted on electronic apparatuses of application examples 1 to 6, for example.

Moreover, in the embodiments and the like, exemplified is the case where the semiconductor layer is configured using an organic semiconductor material. Alternatively, the semiconductor layer may be configured using an inorganic material such as silicon and oxide semiconductor.

Furthermore, for example, the material and the thickness of each layer or the film formation method and the film formation condition thereof are not limited to those described in the embodiments and the like. Other materials and thickness, or other film formation methods and film formation conditions may be used.

[Third Embodiment]

Figure 11:
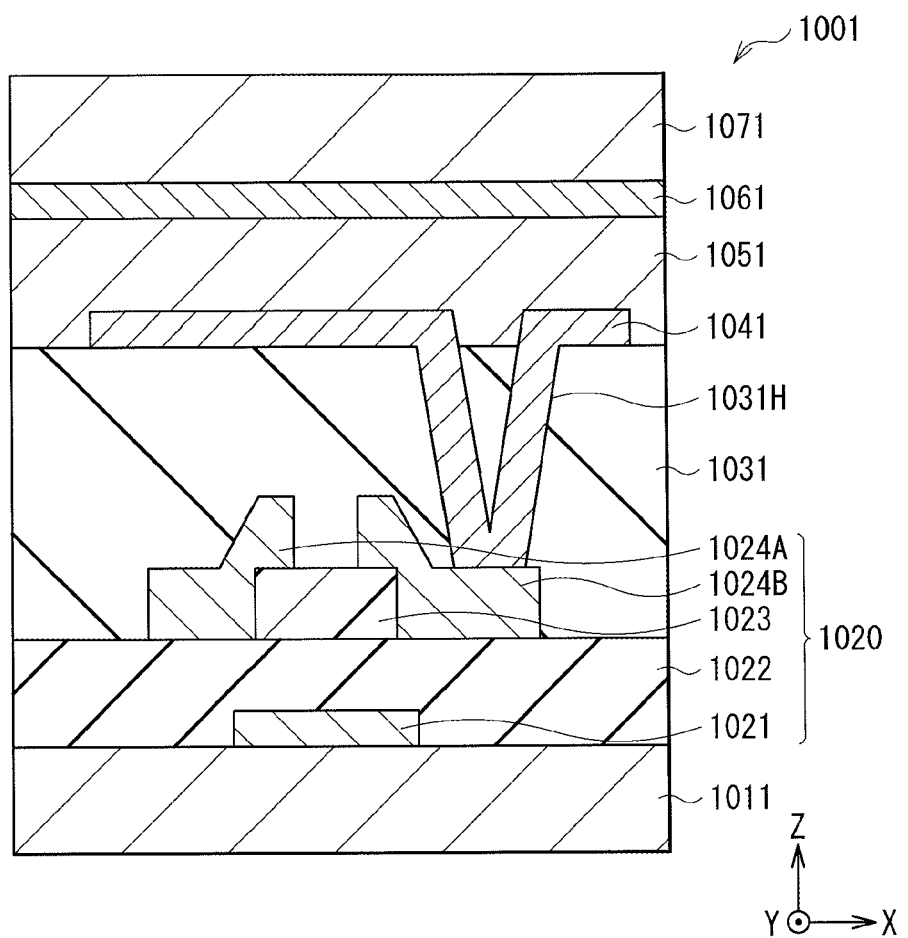
FIG. 11 is a sectional diagram illustrating a structure of a main part of a display according to a third embodiment of the disclosure.

FIG. 11 illustrates a part of a cross-sectional structure of a display (a display 1001) according to a third embodiment of the technology. The display 1001 is an active matrix display, and includes a transistor 1020 as a driving device, an interlayer insulating film 1031, a pixel electrode 1041 (an electrode), a display layer 1051, a common electrode 1061, and a counter substrate 1071 in this order on a substrate 1011. The transistor 1020 is a bottom-gate top-contact organic TFT, and includes a gate electrode 1021, a gate insulating film 1022, a semiconductor film 1023, and source-drain electrodes 1024A and 1024B in this order from the substrate 1011 side. Note that FIG. 11 schematically illustrates the structure of the display 1001, and a size and a shape thereof are different from an actual size and an actual shape in some cases.

The substrate 1011 is formed of an inorganic material such as glass, quarts, silicon, and gallium arsenide, a film formed of polyethylene terephthalate (PET), polyethylene naphthalate (PEN), polyether sulfone (PES), polyether imide, polyether ether ketone (PEEK), polyphenylene sulfide, polyarylate, polyimide, polyamide, polycarbonate (PC), cellulose triacetate, polyolefin, polystyrene, polyethylene, polypropylene, polymethylmethacrylate (PMMA), polyvinyl chloride, polyvinylidene chloride, an epoxy resin, a phenol resin, a urea resin, a melamine resin, a silicone resin, an acrylic resin, or the like, or a metal foil, for example. The substrate 1011 may be a rigid substrate formed of silicon or the like, or may be a flexible substrate formed of a thin glass, the above-described plastic films, or the like. If the substrate 1011 is a flexible substrate, a foldable flexible display is achievable. The substrate 1011 may have conductivity.

The gate electrode 1021 applies a gate voltage to the transistor 1020, and controls a carrier density of the semiconductor film 1023 using the gate voltage to form a channel region (a channel region 1023A in FIG. 12 described later). The gate electrode 1021 is provided in a selective region on the substrate 1011 to have a thickness of, for example, 10 nm to 1000 nm (in a Z-axis direction). The gate electrode 1021 is formed of a single metal such as gold (Au), silver (Ag), copper (Cu), platinum (Pt), titanium (Ti), ruthenium (Ru), molybdenum (Mo), tungsten (W), nickel (Ni), aluminum (Al), and tantalum (Ta), or an alloy thereof. Films formed of these metals may be layered to form the gate electrode 1021. In addition, the gate electrode 1021 may be configured using an oxide film formed of indium tin oxide (ITO), indium zinc oxide (IZO), zinc oxide (ZnO), or the like, or using a conductive carbonized material such as carbon nanotube (CN) and graphene.

The gate insulating film 1022 is provided between the gate electrode 1021 and the semiconductor film 1023 to insulate the gate electrode 1021 from the semiconductor film 1023 electrically connected to the source-drain electrodes 1024A and 1024B. The gate insulating film 1022 has a thickness of about 10 nm to about 1000 nm, for example. The gate insulating film 1022 is configured using an organic insulating film formed of polyvinylpyrrolidone (PVP), polyvinyl phenol, PMMA, polyvinyl alcohol (PVA), PI, or the like. The gate insulating film 1022 may be configured using an oxide film formed of silicon oxide ($SiO_2$), titanium oxide ($TiO_2$), aluminum oxide ($Al_2O_3$), tantalum oxide ($Ta_2O_5$), or the like, or a nitride film formed of silicon nitride (SiNx) or the like.

Figure 12:
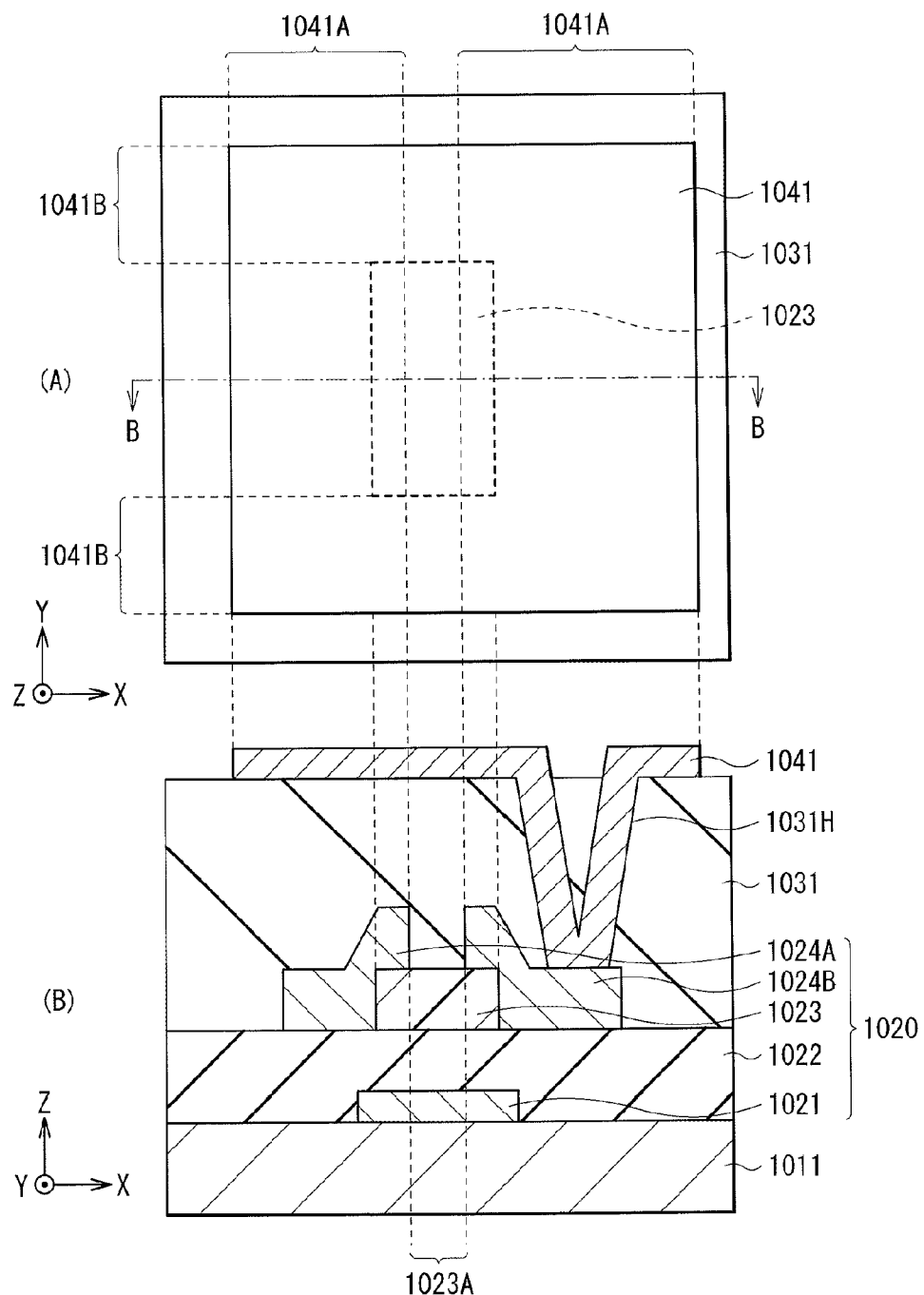
FIG. 12 is a diagram illustrating a relationship between a semiconductor film and a pixel electrode illustrated in FIG. 11.

The semiconductor film 1023 is provided in an island shape on the gate insulating film 1022, and has the channel region 1023A between the source-drain electrode 1024A and the source-drain electrode 1024B as illustrated in FIG. 12. In the third embodiment, as illustrated in (A) of FIG. 12, the semiconductor film 1023 is covered with the pixel electrode 1041, and all of four sides of the semiconductor film 1023, which has a rectangular planar shape, are located to face the pixel electrode 1041, inside a planar region of the pixel electrode 1041. Therefore, the channel region 1023A of the semiconductor film 1023 is provided in a position closer to a center portion of the pixel electrode 1041, and isotropy of the channel region 1023A is improved. Consequently, the TFT characteristics of the transistor 1020 are allowed to be improved. (B) of FIG. 12 illustrates a cross-sectional structure taken along a B-B line of (A) of FIG. 12.

Figure 13:
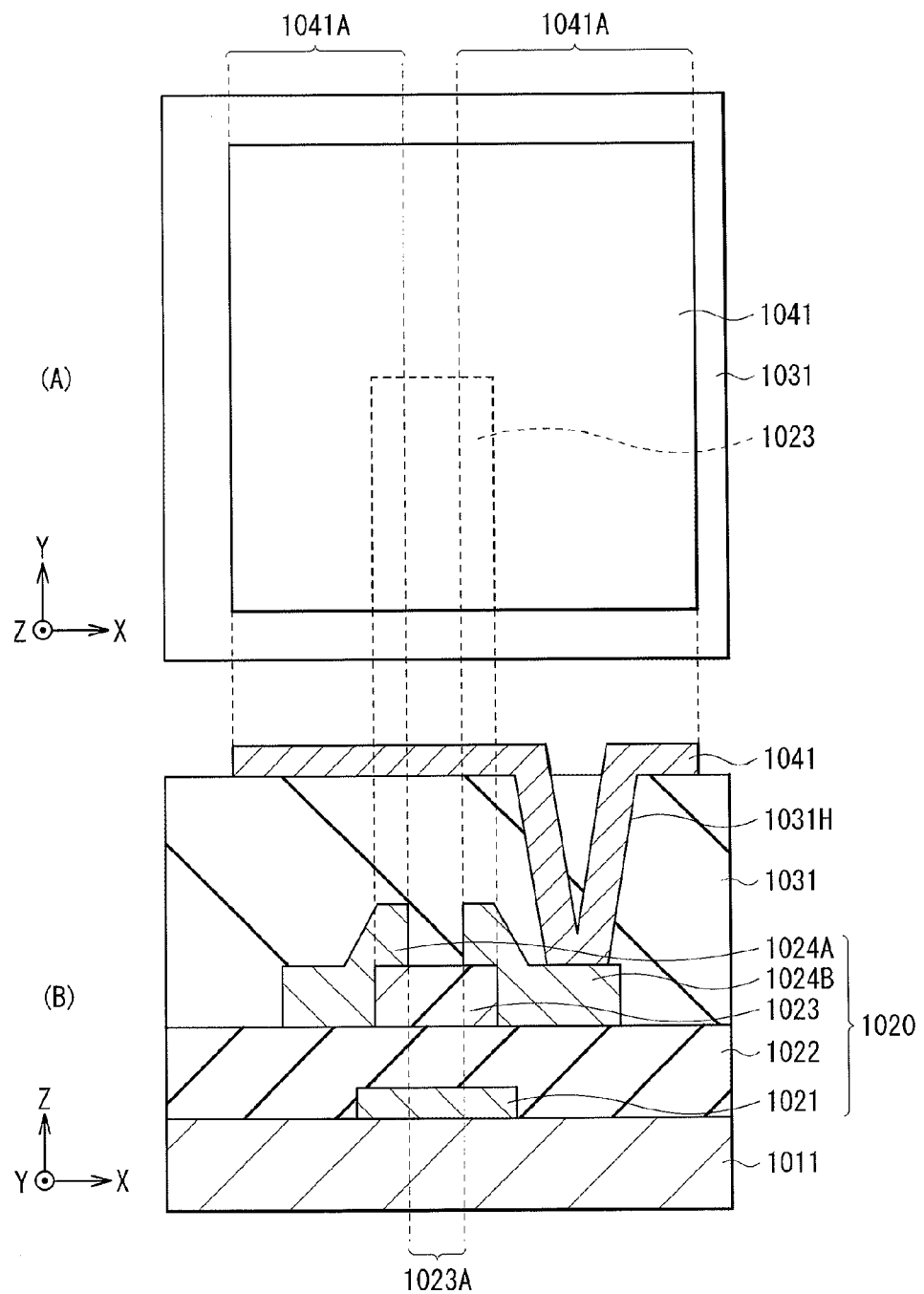
FIG. 13 is a diagram illustrating another example of an arrangement of the semiconductor film illustrated in FIG. 12.
Figure 14:
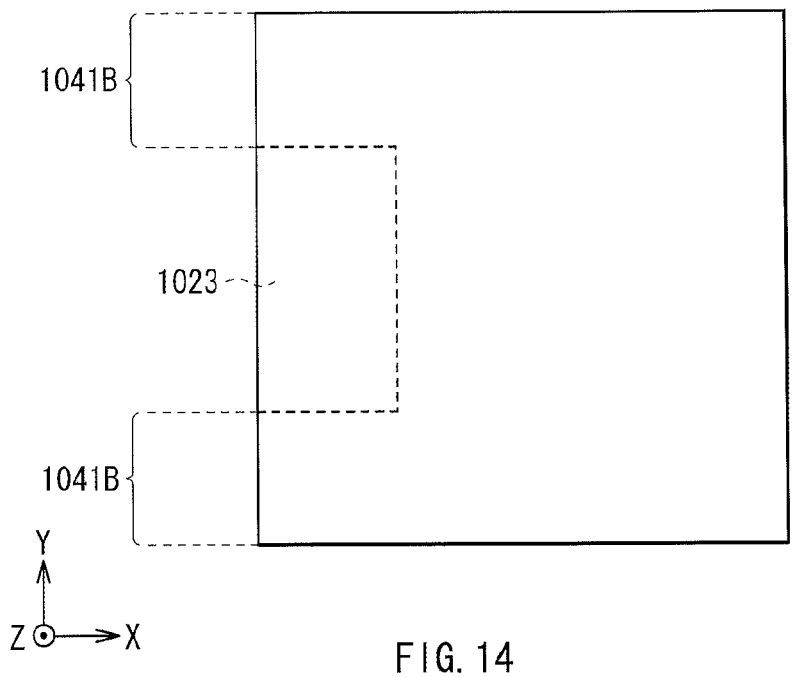
FIG. 14 is a plan view illustrating still another example of the arrangement of the semiconductor film illustrated in FIG. 12.

To further improve the isotropy of the channel region 1023A, the source-drain electrodes 1024A and 1024B are also preferably covered with the pixel electrode 1041. However, at least sides facing each other of the channel region 1023A are located to face the pixel electrode 1041, inside the planar region of the pixel electrode 1041. In addition, although all of the sides configuring a planar shape of the semiconductor film 1023 (or the channel region 1023A) are preferably located to face the pixel electrode 1041, inside the planar region of the pixel electrode 1041, at least one pair of sides facing each other of the semiconductor film 1023 may be located to face the pixel electrode 1041, inside the planar region of the pixel electrode 1041, as illustrated in FIG. 13 and FIG. 14. Alternatively, a pair of sides facing each other in the channel length (the X-axis) direction (FIG. 13) or in the channel width (the Y-axis) direction (FIG. 14) may be located to face the pixel electrode 1041, inside the planar region of the pixel electrode 1041. If the semiconductor film 1023 has a quadrilateral shape, three sides thereof are disposed inside the planar region of the pixel electrode 1041.

The semiconductor film 1023 is formed of an organic semiconductor material, specifically, is formed of, for example, polycyclic aromatic hydrocarbon such as pentacene, anthracene, and rubrene, a low-molecular compound such as tetracyanoquinodimethane (TCNQ), or a high-molecular compound such as polyacetylene, poly(3-hexylthiophene) (P3HT), and poly(paraphenylene vinylene) (PPV). The semiconductor film 1023 has a thickness of about 1 nm to about 1000 nm.

The pair of source-drain electrodes 1024A and 1024B is provided on the semiconductor film 1023, and is in contact with the semiconductor film 1023 to be electrically connected thereto. As a material of the source-drain electrodes 1024A and 1024B, a material similar to that of the gate electrode 1021 may be used, and thus the source-drain electrodes 1024A and 1024B are configured using, for example, a metal film formed of gold, silver, copper, aluminum, or the like, an oxide film formed of ITO, or the like, or a conductive carbonized material film formed of carbon nanotube, graphene, or the like. Each of the source-drain electrodes 1024A and 1024B has a thickness of, for example, about 10 nm to about 1000 nm.

The interlayer insulating film 1031 planarizes the surface of the substrate 1011 provided with the transistor 1020, and has a connection hole 1031H making conduction between the source-drain electrode 1024B (the transistor 1020) and the pixel electrode 1041. The interlayer insulating film 1031 may be formed of, for example, silicon oxide, silicon nitride, aluminum oxide, aluminum nitride (AlN), tantalum oxide, or aluminum oxynitride ($AlO_xN_{1-x}$, where X=0.01 to 0.2). Organic materials such as PVA, polyvinyl phenol, novolak resin, acrylic resin, and fluorine-based resin may be used for the interlayer insulating film 1031.

The pixel electrode 1041 is provided on the interlayer insulating film 1031 for each pixel, and applies a voltage to the display layer 1051 between the pixel electrode 1041 and the common electrode 1061. In a planar view of the display 1001, an area of the pixel electrode 1041 is larger than that of the channel region 1023A, and all sides of the channel region 1023A are located to face the pixel electrode 1041, inside the planar region of the pixel electrode 1041 as described above. In other words, the pixel electrode 1041 includes non-overlapping regions (non-overlapping regions 1041A and 1041B) outside the channel region 1023A. The non-overlapping regions 1041A and 1041B are regions hanging over beyond the channel region 1023A toward the outer side. The non-overlapping region 1041A is a pair of regions facing each other in the channel length direction with the channel region 1023A in between, and the non-overlapping region 1041B is a pair of regions facing each other in the channel width direction with the channel region 1023A in between. Although the pixel electrode 1041 preferably has the non-overlapping regions 1041A and 1041B in both directions (FIG. 12), may have one of the non-overlapping regions 1041A and 1041B (FIG. 13 and FIG. 14).

Figure 15:
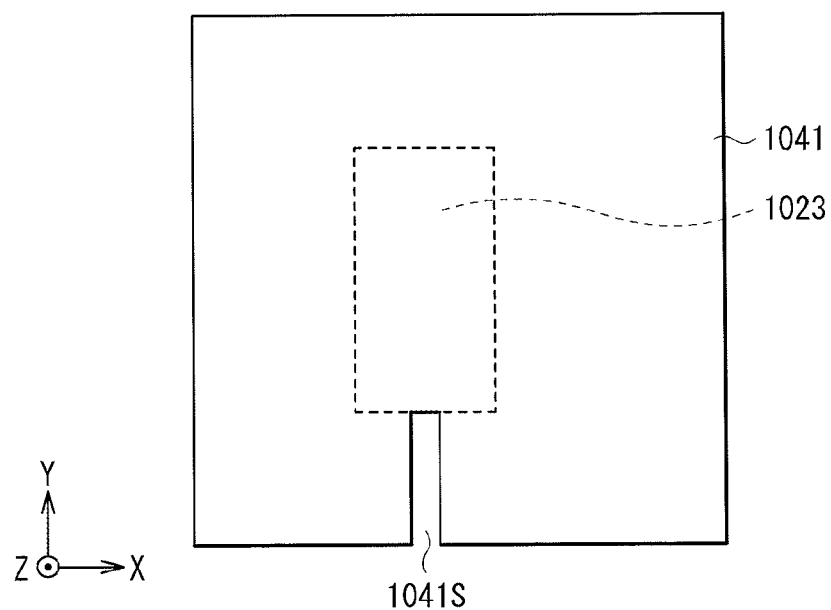
FIG. 15 is a plan view illustrating another example of the pixel electrode illustrated in FIG. 12.

The pixel electrode 1041 has a quadrilateral planar shape such as a square, a rectangular, and a parallelogram, and is configured using a metal film formed of gold, silver, copper, aluminum, or the like, an oxide film formed of ITO or the like, or a conductive carbonized material film formed of carbon nanotube, graphene, or the like. As illustrated in FIG. 15, the pixel electrode 1041 may have a slit 1041S to prevent overlapping with wirings such as signal lines. The pixel electrode 1041 has a thickness of, for example, about 10 nm to about 1000 nm.

The display layer 1051 is provided between the pixel electrode 1041 and the common electrode 1061, and is driven by the transistor 1020 for each pixel. The display layer 1051 is configured of, for example, a liquid crystal layer, an organic EL layer, an inorganic EL layer, or an electrophoretic display element. The common electrode 1061 is common to the pixels, and is provided over one surface of the counter substrate 1071, for example. The common electrode 1061 is formed of a transparent conductive material such as ITO, and has a thickness of, for example, about 10 nm to about 1000 nm.

The counter substrate 1071 is configured using a material similar to that of the substrate 1011, for example. In the display 1001, images are displayed on the counter substrate 1071 side. A moisture proof film to prevent infiltration of water to the display layer 1051, an optical functional film to prevent reflection of external light, and the like may be provided on the counter substrate 1071.

The display 1001 is manufactured, for example, in the following manner.

First, a conductive film is formed on the entire surface of the substrate 1011 with use of vacuum plasma technology such as evaporation and sputtering, and then the formed conductive film is patterned by lithography or etching to form the gate electrode 1021 in a desired shape. The conductive film may be formed by a coating and printing method such as screen printing and an inkjet method. In the case where the degree of roughness on the surface of the substrate 1011 is large, a chemical polishing process or a planarization process such as formation of a planarization film may be performed on the substrate 1011 before formation of the gate electrode 1021. Note that the case where the degree of roughness on the surface of the substrate 1011 is large indicates, for example, a case where large asperity or steep asperity, which causes discontinuous film formed on the substrate 1011, exists on the surface of the substrate 1011.

After formation of the gate electrode 1021, a film of silicon oxide is formed on the substrate 1011 and the gate electrode 1021 by, for example, evaporation or sputtering, to form the gate insulating film 1022. The gate insulating film 1022 may be formed using an organic insulating material by a coating method such as spin coating and slit coating. After formation of the gate insulating film 1022, the semiconductor film 1023 is patterned and formed by a vacuum deposition method using a metal mask or a coating method such as spin coating and an inkjet method. A vacuum deposition method is preferably used when an organic semiconductor material of the semiconductor film 1023 is a low-molecular compound, whereas a coating and printing method is preferably used when the organic semiconductor material of the semiconductor film 1023 is a soluble high-molecular compound.

Subsequently, a conductive film is formed on the gate insulating film 1022 and the semiconductor film 1023 with use of vacuum plasma technology such as evaporation and sputtering. Then, the conductive film is patterned by lithography and etching to form the pair of source-drain electrodes 1024A and 1024B. Accordingly, the transistor 1020 is formed on the substrate 1011. The conductive film configuring the source-drain electrodes 1024A and 1024B may be formed by a coating and printing method such as screen printing and an inkjet method as the gate insulating film 1022.

Subsequently, the interlayer insulating film 1031 is formed on the transistor 1020, and then the connection hole 1031H is formed with use of a semiconductor lithography and etching. The interlayer insulating film 1031 may be formed by, for example, spin coating or screen printing when the insulating material of the interlayer insulating film 1031 is soluble, whereas the interlayer insulating film 1031 may be formed by, for example, sputtering when the insulating material is insoluble.

After the connection hole 1031H is formed in the interlayer insulating film 1031, patterning is performed for each pixel to form the pixel electrode 1041 on the interlayer insulating film 1031, and the transistor 1020 is electrically connected to the pixel electrode 1041. At this time, the pixel 1041 is disposed on the transistor 1020 to have the non-overlapping regions 1041A and 1041B. The pixel electrode 1041 may be formed, for example, in a manner similar to that of the source-drain electrodes 1024A and 1024B.

After formation of the pixel electrode 1041, the display layer 1051 is formed on the pixel electrode 1041. After that, the counter substrate 1071 including the common electrode 1061 is allowed to face the substrate 1011 formed with up to the display layers 1051. In this way, the display 1001 illustrated in FIG. 11 is completed.

In the display 1001 according to the third embodiment, all sides of the channel region 1023A are located inside the pixel electrode 1041 in a planar view. As a result, the TFT characteristics of the transistor 1020 are improved. The detail thereof will be described below with reference to a comparative example.

Figure 16:
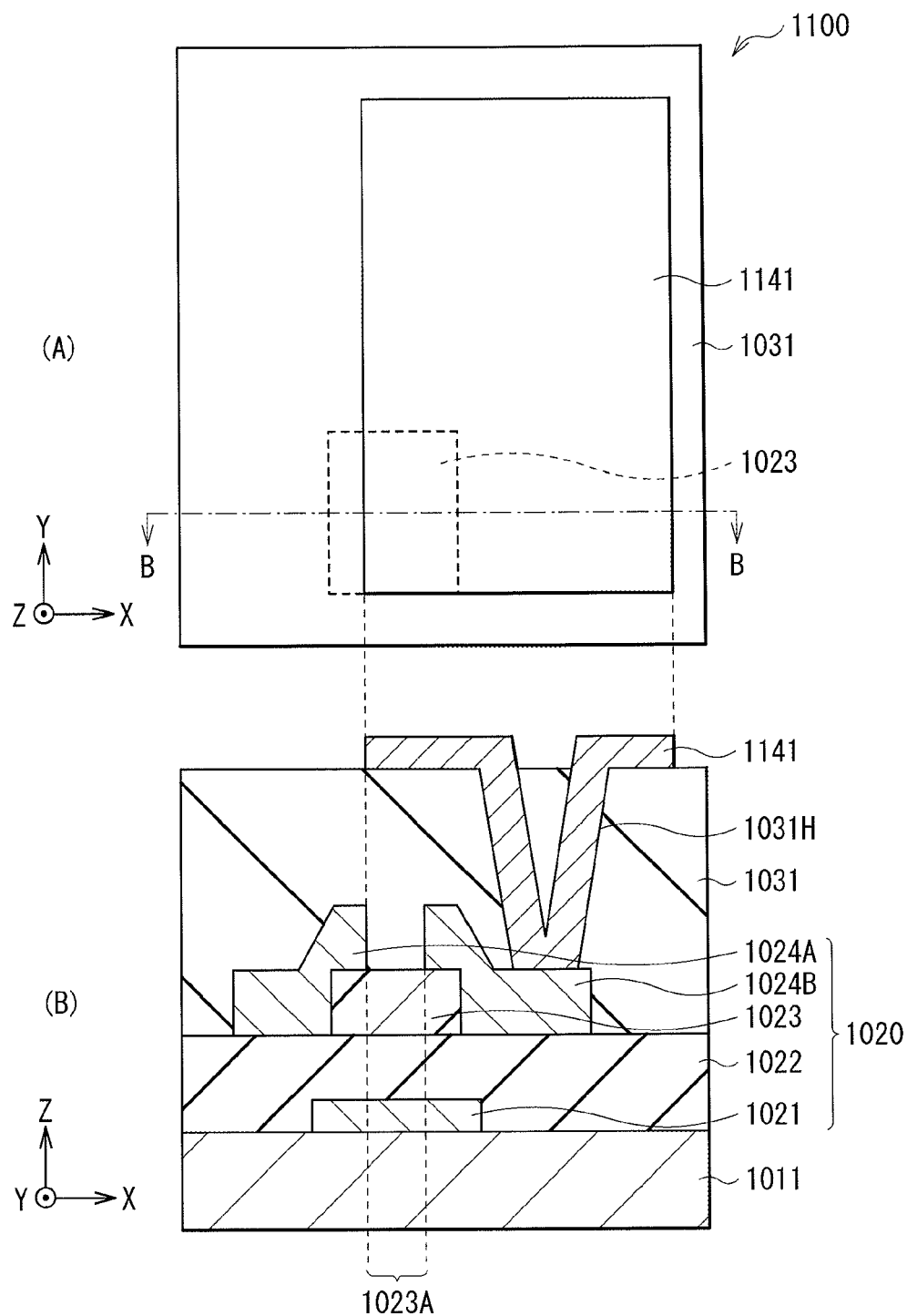
FIG. 16 is a diagram illustrating a structure of a display according to a comparative example.

FIG. 16 illustrates a structure of a display (a display 1100) according to a comparative example, where (A) of FIG. 16 illustrates a plane structure of the display 1100 and (B) of FIG. 16 illustrates a cross-sectional structure taken along a B-B line in (A) of FIG. 16. In the display 1100, two sides (in X-axis direction and Y-axis direction), which are orthogonal to each other, of the rectangular channel region 1023A in a planar view are overlapped with two sides of a pixel electrode (a pixel electrode 1141). In other words, the channel region 1023A is disposed at a corner of the pixel electrode 1141. In such a display 1100, isotropy of the channel region 1023A is lowered, and stress applied to the channel region 1023A is non-uniform. As a result, the TFT characteristics are degraded. Moreover, in the display 1100, the channel region 1023A (the semiconductor film 1023) is easily deteriorated due to exposure to the air.

In contrast, in the display 1001, all sides of the channel region 1023A are located inside the pixel electrode 1041 in a planar view, namely, the channel region 1023A is located in a position closer to the center of the pixel electrode 1041. Accordingly, the isotropy of the channel region 1023A is improved, and the stress applied to the channel region 1023A is made uniform. As a result, the TFT characteristics of the transistor 1020 are improved. In particular, when the substrate 1011 is a flexible substrate, namely, when the display 1001 is a flexible display, influence of the stress is increased so that the TFT characteristics of the transistor 1020 are effectively improved. In addition, since the semiconductor film 1023 is mostly covered with the pixel electrode 1041, deterioration of the channel region 1023A due to air intrusion is suppressed.

Figure 17A:
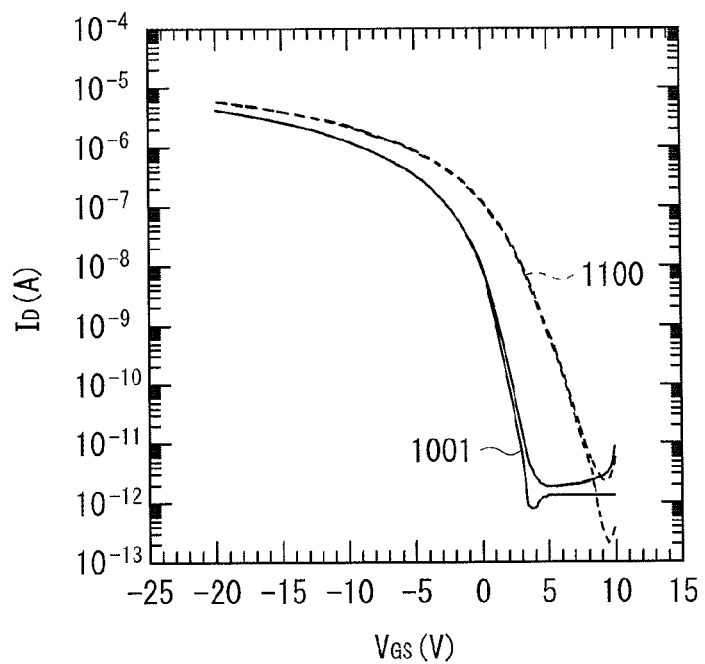
FIGS. 17A and 17B are diagrams illustrating transport properties of a transistor illustrated in FIG. 11.

FIG. 17A illustrates a transport property of the transistor in each of the display 1001 (a solid line) and the display 1100 (a dashed line), and a horizontal axis indicates a gate voltage ($V_{GS}$) and a vertical axis indicates a drain current ($I_D$). The gate voltage $V_{GS}$ at rising is about 8 V in the display 1100, whereas is about 3 V in the display 1001. In other words, the display 1001 is driven by a voltage lower than that of the display 1100.

Figure 17B:
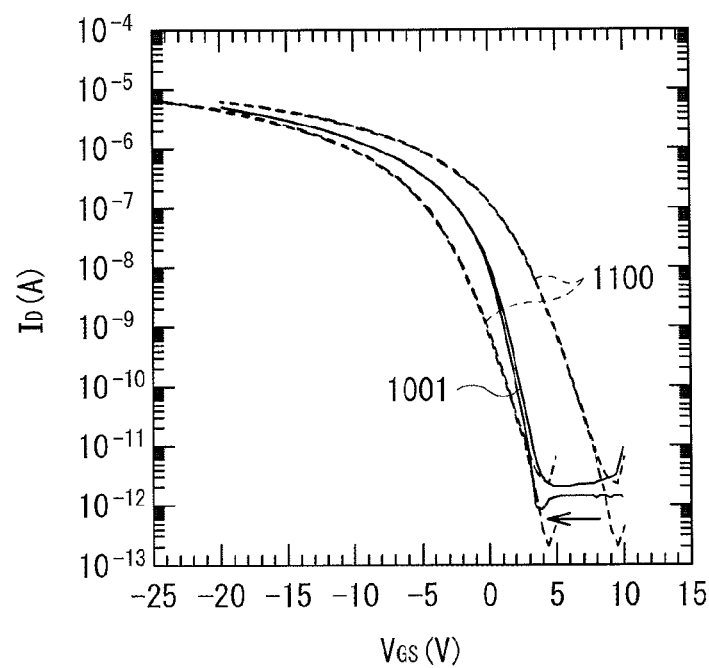

FIG. 17B is a diagram illustrating comparison of the drain current ($I_D$) of the displays 1100 and 1001 in the state where the gate voltage $V_{GS}$ of the display 1100 is shifted in illustration by a reduction amount of the voltage (5 V) of the display 1001. It is apparent from the diagram that the drain current $I_D$ of the display 1001 is not decreased compared with that of the display 1100. Therefore, it is confirmed that the display 1001 is allowed to be driven by a lower voltage without decreasing the maximum field effect mobility of the transistor 1020.

Figure 18A:
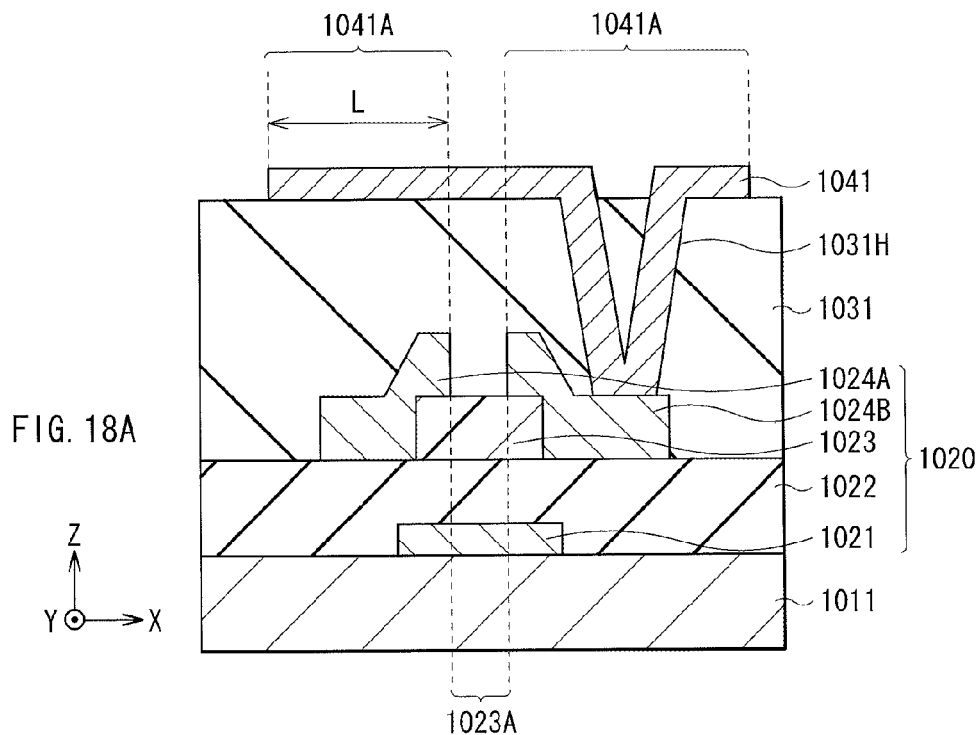
FIGS. 18A and 18B are diagrams for explaining a relationship between an arrangement of the pixel electrode illustrated in FIG. 12 and a rising voltage.
Figure 18B:
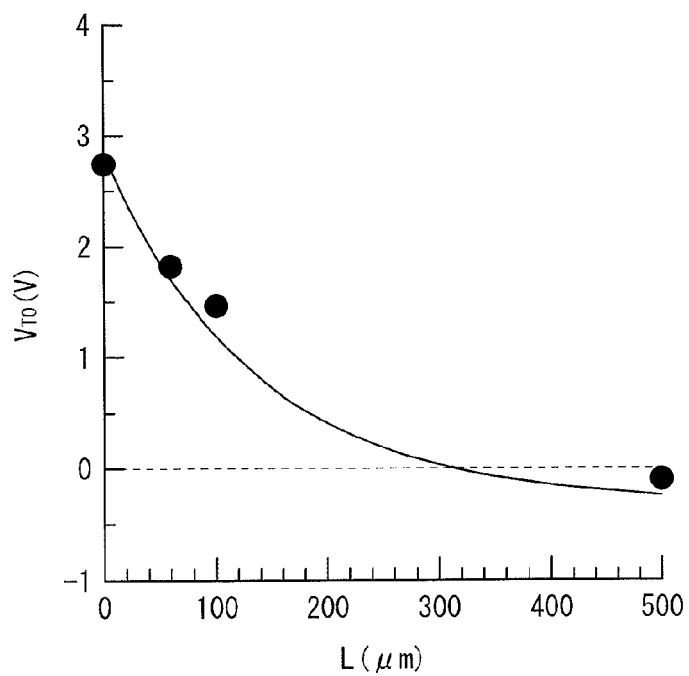

In the display 1001, the channel region 1023A is disposed in a position closer to the center of the pixel electrode 1041 so that the TFT characteristics of the transistor 1020 are improved. FIGS. 18A and 18B illustrate a relationship between the rising voltage ($V_{T0}$) and the length (L) of one (on the source-drain electrode 1024A side) of the pair of the non-overlapping regions 1041A, where $V_{T0}$ is a gate voltage $V_{GS}$ when the drain current $I_D$ is $10^{-8}$ A. Note that the length of the other of the pair of the non-overlapping regions 1041A and the length of each of the pair of the non-overlapping regions 1041B ((B) of FIG. 12) are each equal to or larger than L. In other words, the measurement is carried out in a state where all sides of the channel region 1023A are located inside the planar region of the pixel electrode 1041. At this time, the rising voltage $V_{T0}$ gradually decreases as the length L increases, and when the L is 200 to 300 μm, $V_{T0}$ reaches 0 V (FIG. 18B). Accordingly, the channel region 1023A is provided in a position closer to the center of the pixel electrode 1041 so that the rising voltage $V_{T0}$ is approached to 0 V.

As described above, in the display 1001 of the third embodiment, at least the pair of sides facing each other of the channel region 1023A is located to face the pixel electrode 1041, inside the planar region of the pixel electrode 1041. Therefore, the isotropy of the channel region 1023A is improved, and the TFT characteristics of the transistor 1020 are improved. Consequently, the display 1001 is allowed to be driven by lower power.

Hereinafter, although a modification of the third embodiment will be described, like numerals are used to designate substantially like components of the third embodiment, and the description thereof will be appropriately omitted.

[Modification 3]

Figure 19:
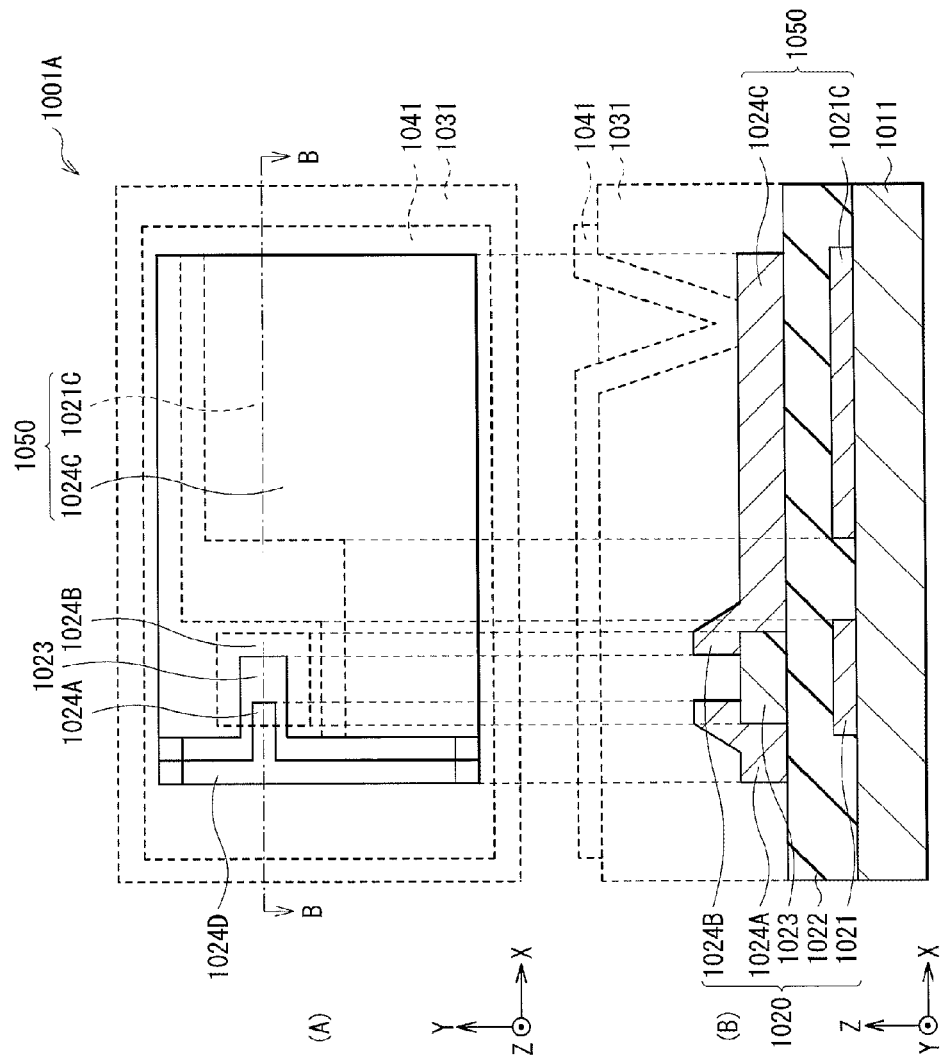
FIG. 19 is a diagram illustrating a structure of a main part of a display according to another modification.

FIG. 19 illustrates a structure of a main part of a display (a display 1001A) according to a modification 3 of the third embodiment. (A) of FIG. 19 illustrates a plane structure of the display 1001A, and (B) of FIG. 19 illustrates a cross-sectional structure taken along a B-B line in (A) of FIG. 19. The display 1001A includes a retention capacity 1050. Except for this point, the display 1001A has a structure similar to that of the display 1001 of the third embodiment, and also has functions and effects similar to those of the display 1001.

Figure 20:
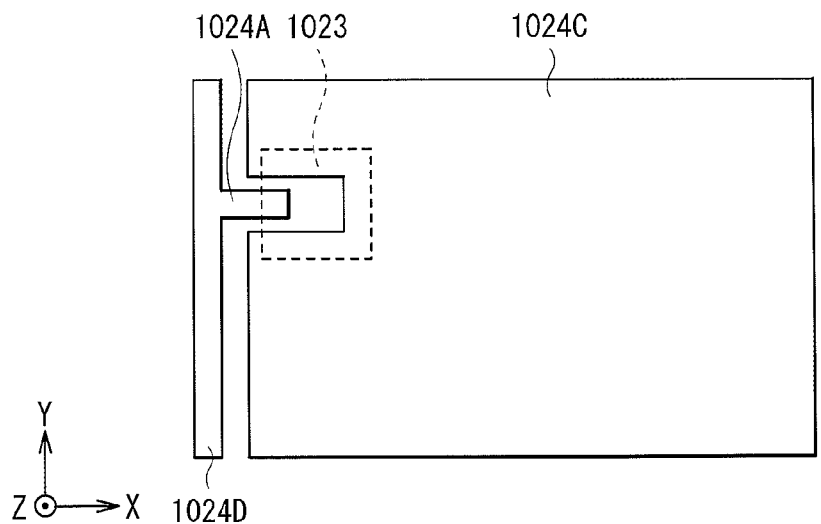
FIG. 20 is a plan view illustrating a relationship between a semiconductor film and an upper electrode illustrated in FIG. 19.

The retention capacitor 1050 includes a lower electrode 1021C (a second electrode) and an upper electrode 1024C (a third electrode), and a gate insulating film 1022 is provided between the lower electrode 1021C and the upper electrode 1024C. The lower electrode 1021C is provided in the same layer as the gate electrode 1021, and the upper electrode 1024C is integrated with the source-drain electrode 1024B. A wiring 1024D provided in the same layer as the source-drain electrodes 1024A and 1024B is connected to the source-drain electrode 1024A. The wiring 1024D is, for example, a signal line. In the display 1001A, the retention capacitor 1050 is provided in each of regions facing each other in the channel width (Y-axis) direction with the semiconductor film 1023 (the channel region 1023A) in between. In other words, the upper electrode 1024C (the source-drain electrode 1024B) surrounds the semiconductor film 1023 from three directions (FIG. 20). Accordingly, since the retention capacity 1050 (the upper electrode 1024C) is provided over a wide region, the capacity is increased. In particular, since the large capacity is demanded when the display layer 1051 is configured of an electrophoretic display element, the retention capacity 1050 is preferably provided in such a way. The pixel electrode 1041 is provided to cover the entire upper electrode 1024C.

Figure 21:
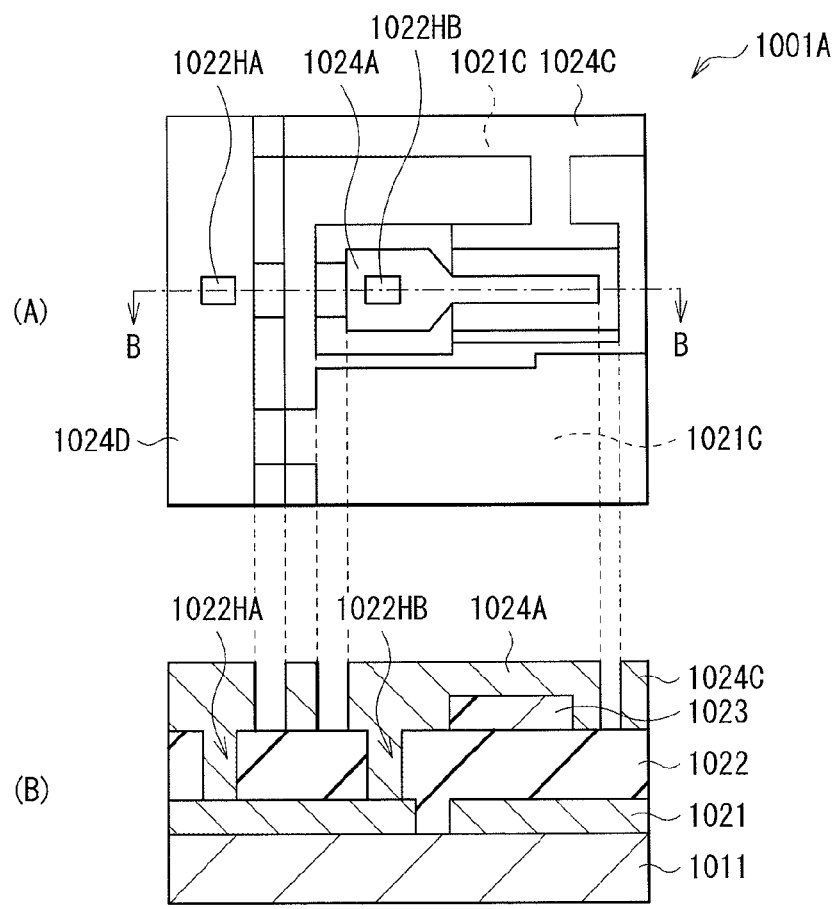
FIG. 21 is a diagram illustrating another example of a retention capacity illustrated in FIG. 19, where (A) is a plan view thereof and (B) is a sectional diagram taken along a B-B line in (A).
Figure 22:
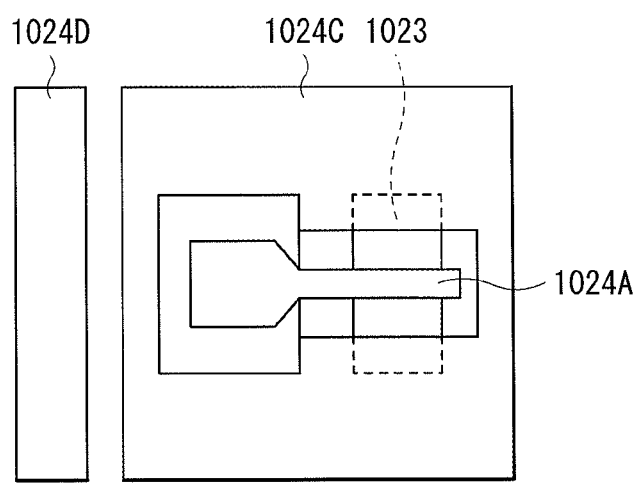
FIG. 22 is a plan view illustrating a relationship between a semiconductor film and an upper electrode illustrated in FIG. 21.

As illustrated in (A) and (B) of FIG. 21, all sides of the semiconductor film 1023 may be surrounded by the upper electrode 1024C by, for example, electrically connecting the source-drain electrode 1024A and the wiring 1024D through connection holes 1022HA and 1022HB which are provided in the gate insulating film (FIG. 22).

A transistor, a display, and an electronic apparatus are provided with higher reliability when the third embodiment and the modification 3 are implemented together with any of the first embodiment, the modification 1, the second embodiment, and the modification 2 at the same time.

The displays 90 and 1001 (or the display 1001A) are allowed to be mounted in electronic apparatuses illustrated in application examples 1 to 6 described below.

APPLICATION EXAMPLE 1

Figure 23A:
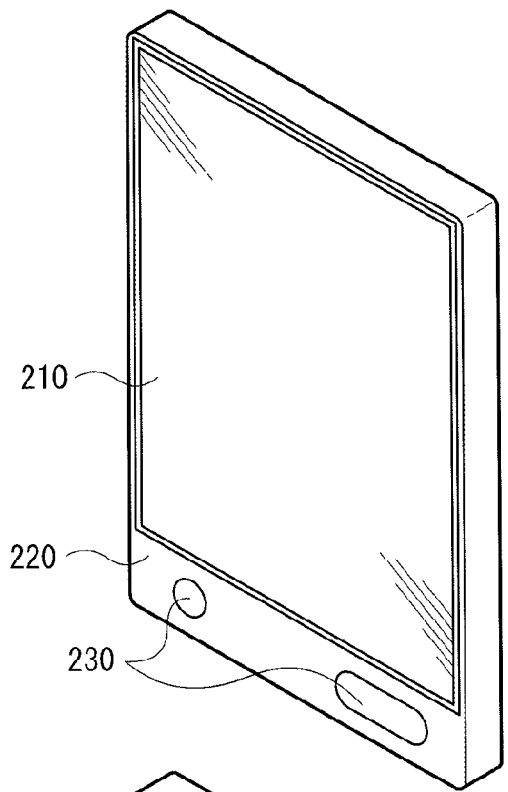
FIGS. 23A and 23B are perspective views each illustrating an appearance of an application example 1.
Figure 23B:
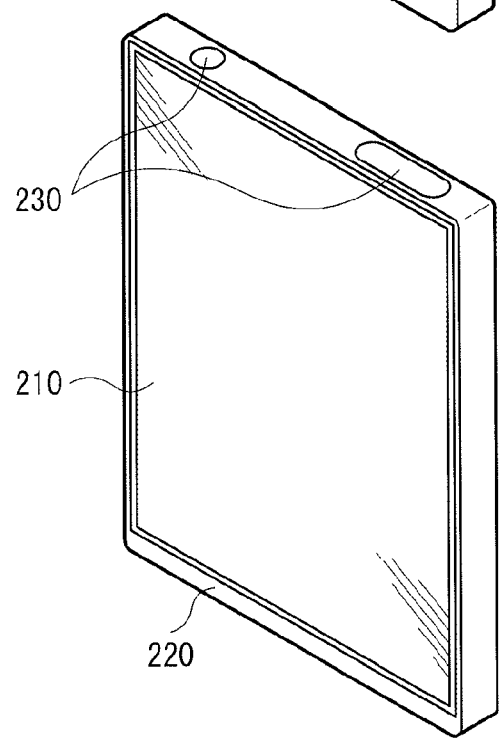

FIGS. 23A and 23B each illustrate an appearance of an electronic book. The electronic book includes, for example, a display section 210, a non-display section 220, and an operation section 230, and the display 210 is configured of the display 90, 1001, or 1001A. The operation section 230 may be provided on the surface (a front surface) same as the display section 210 as illustrated in FIG. 23A, or may be provided on a surface (a top surface) different from the display section 210 as illustrated in FIG. 23B.

APPLICATION EXAMPLE 2

Figure 24:
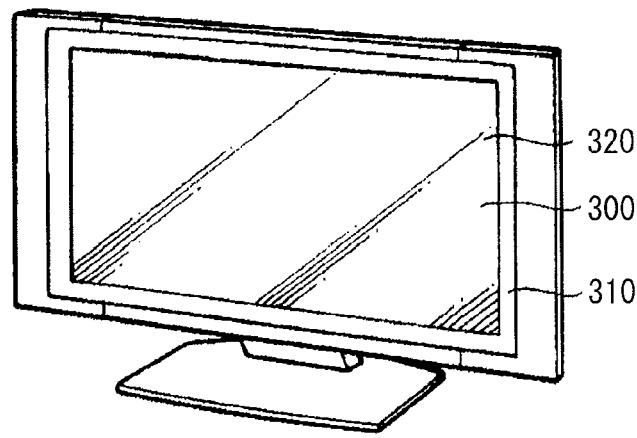
FIG. 24 is a perspective view illustrating an appearance of an application example 2.

FIG. 24 illustrates an appearance of a television. The television includes, for example, an image display screen section 300 including a front panel 310 and a filter glass 320, and the image display screen section 300 is configured of the display 90, 1001, or 1001A.

APPLICATION EXAMPLE 3

Figure 25A:
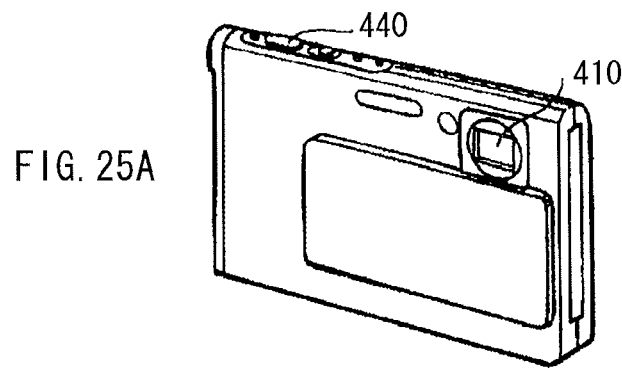
FIG. 25A is a perspective view illustrating an appearance of an application example 3 viewed from a front side thereof.
Figure 25B:
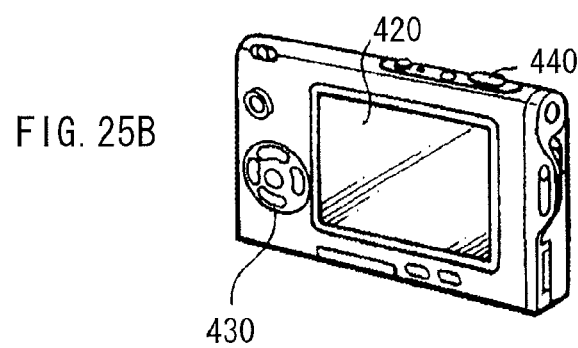
FIG. 25B is a perspective view illustrating the appearance viewed from a back side thereof.

FIGS. 25A and 25B each illustrate an appearance of a digital still camera. The digital still camera includes, for example, a light emitting section 410 for flash, a display section 420, a menu switch 430, and a shutter button 440, and the display section 420 is configured of the display 90, 1001, or 1001A.

APPLICATION EXAMPLE 4

Figure 26:
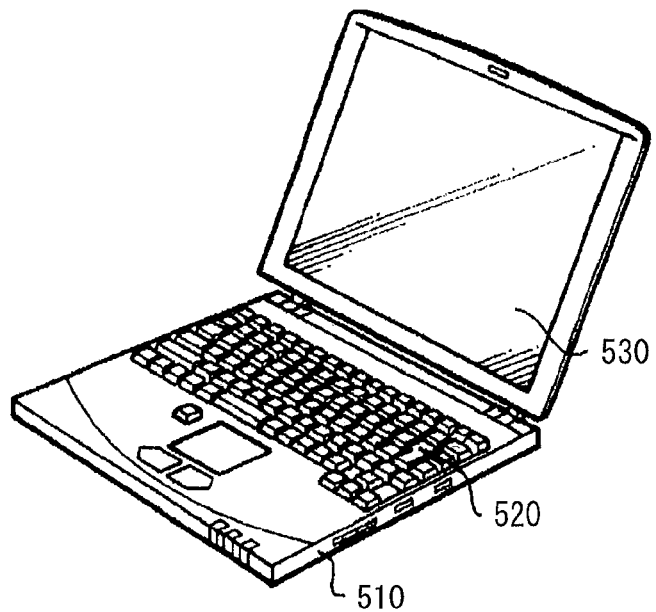
FIG. 26 is a perspective view illustrating an appearance of an application example 4.

FIG. 26 illustrates an appearance of a notebook personal computer. The notebook personal computer includes, for example, a main body 510, a keyboard 520 for input operation of characters and the like, and a display section 530 displaying images, and the display section 530 is configured of the display 90, 1001, or 1001A.

APPLICATION EXAMPLE 5

Figure 27:
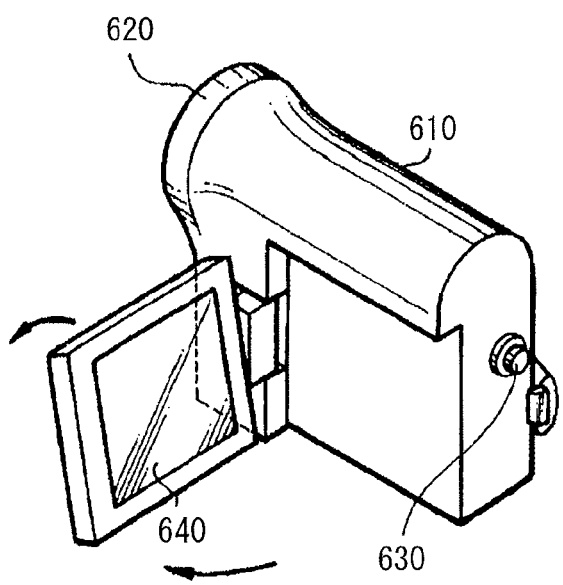
FIG. 27 is a perspective view illustrating an appearance of an application example 5.

FIG. 27 illustrates an appearance of a video camcorder. The video camcorder includes, for example, a main body 610, a lens 620 for shooting an object, provided in a front side surface of the main body 610, a start and stop switch 630 for shooting, and a display section 640. The display section 640 is configured of the display 90, 1001, or 1001A.

APPLICATION EXAMPLE 6

FIGS. 28A to 28G each illustrate an appearance of a mobile phone. The mobile phone is configured of, for example, an upper housing 710 and a lower housing 720 connected to each other by a coupling section (a hinge section) 730, and includes a display 740, a sub-display 750, a picture light 760, and a camera 770. The display 740 and/or the sub-display 750 are/is configured of the display 90, 1001, or 1001A.

Figure 1B:
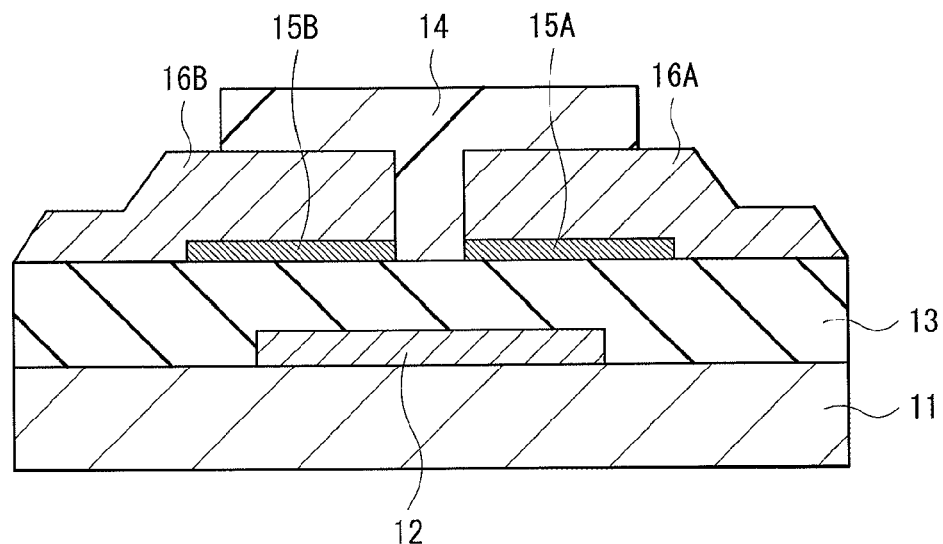
FIG. 1B is a sectional diagram illustrating a structure of a transistor according to a modification.

Hereinbefore, although the technology has been described with referring to the embodiments and the modifications, the technology is not limited thereto, and various modifications may be made. For example, although the top-contact bottom-gate transistors 1, 1A, 2, 2A, and the like have been described in the embodiments and the like, the technology may be applied to a bottom-contact bottom-gate transistor as illustrated in FIG. 1B, or may be applied to a transistor having a top-gate structure.

For example, the material and the thickness of each layer or the film formation method and the film formation condition thereof are not limited to those described in the embodiments and the like. Other materials and thickness, or other film formation methods and film formation conditions may be used.

Moreover, in the embodiments and the like, the description has been given of the case where the transistor 1020 is an organic TFT, that is, the case where the semiconductor film 1023 is formed of an organic semiconductor material. Alternatively, the semiconductor film 1023 may be formed of an inorganic semiconductor material such as amorphous silicon and an oxide semiconductor.

Furthermore, in the embodiments and the like, the description has been given of the case where the transistor 1020 is a bottom-gate top-contact type TFT. Alternatively, the transistor 1020 may be of a top-gate top-contact type, of a top-gate bottom-contact type, or of a bottom-gate bottom-contact type.

Note that the technology may be configured as follows.

(1) A transistor including:
a gate electrode;
a semiconductor layer facing the gate electrode with an insulating layer in between;
a pair of source-drain electrodes electrically connected to the semiconductor layer; and
a contact layer provided in a moving path of carriers between each of the pair of source-drain electrodes and the semiconductor layer, the contact layer having end surfaces covered with the source-drain electrode.

(2) The transistor according to (1), wherein the contact layer is provided between the semiconductor layer and each of the pair of source-drain electrodes.

(3) The transistor according to (1) or (2), wherein
the contact layer includes a pair of first contact layer and second contact layer facing each other, the first contact layer and the second contact layer being disposed between the semiconductor layer and each of the pair of source-drain electrodes, and
a surface of the first contact layer and a surface of the second contact layer that face each other are also covered with the source-drain electrodes.

(4) The transistor according to any one of (1) to (3), wherein
the contact layer is provided on the semiconductor layer, and
the pair of the source-drain electrodes is in contact with the insulating layer.

(5) The transistor according to any one of (1) to (4), wherein the contact layer is in a discontinuous state having a plurality of gaps.

(6) The transistor according to (5), wherein the contact layer in the discontinuous state is formed by completion of vacuum film formation before the contact layer is developed to a continuous film.

(7) The transistor according to any one of (1) to (4), wherein the contact layer is a continuous film.

(8) The transistor according to any one of (1) to (7), wherein the contact layer extends on both sides of the semiconductor layer through end surfaces of the semiconductor layer.

(9) A display including a plurality of pixels and a transistor driving the plurality of pixels, the transistor including:
a gate electrode;
a semiconductor layer facing the gate electrode with an insulating layer in between;
a pair of source-drain electrodes electrically connected to the semiconductor layer; and
a contact layer provided in a moving path of carriers between each of the pair of source-drain electrodes and the semiconductor layer, the contact layer having end surfaces covered with the source-drain electrode.

(10) An electronic apparatus with a display, the display including a plurality of pixels and a transistor driving the plurality of pixels, the transistor including:
a gate electrode;
a semiconductor layer facing the gate electrode with an insulating layer in between;
a pair of source-drain electrodes electrically connected to the semiconductor layer; and a contact layer provided in a moving path of carriers between each of the pair of source-drain electrodes and the semiconductor layer, the contact layer having end surfaces covered with the source-drain electrode.

(11) A display including:
a transistor including a semiconductor film, the semiconductor film including a channel region; and
a electrode electrically connected to the transistor and covering the channel region, wherein
one or more pairs of sides facing each other of sides configuring a planar shape of the channel region are located to face the electrode, inside a planar region of the electrode.

(12) The display according to (11), wherein
the planar shape of the channel region is quadrilateral, and
three sides or more of the channel region are located to face the electrode, inside the planar region of the electrode.

(13) The display according to (11) or (12), wherein all sides of the channel region are located to face the electrode, inside the planar region of the electrode.

(14) The display according to any one of (11) to (13), wherein
the semiconductor film, a pair of source-drain electrodes electrically connected to the semiconductor film, and the electrode are provided in this order, and
one or more pairs of sides facing each other of sides configuring the planar shape of the semiconductor film are located to face the electrode, inside the planar region of the electrode.

(15) The display according to (14), wherein the source-drain electrodes are covered with the electrode.

(16) The display according to any one of (11) to (15), further including a retention capacity in each of regions facing each other with the channel region in between, wherein
the retention capacities are covered with the electrode.

(17) The display according to any one of (11) to (16), wherein the semiconductor film is formed of an organic semiconductor material.

(18) The display according to any one of (11) to (17), wherein the transistor and the electrode are provided on a flexible substrate.

(19) The display according to any one of (11) to (18), wherein a gate electrode facing the semiconductor film, the semiconductor film, and the electrode are provided in this order.

(20) An electronic apparatus with a display, the display including:
a transistor including a semiconductor film, the semiconductor film including a channel region; and
a electrode electrically connected to the transistor and covering the channel region, wherein
one or more pairs of sides facing each other of sides configuring a planar shape of the channel region are located to face the electrode, inside a planar region of the electrode.

The present application contains subject matter related to that disclosed in Japanese Priority Patent Application JP 2011-257438 filed in the Japan Patent Office on Nov. 25, 2011 and Japanese Priority Patent Application JP 2012-038230 filed in the Japan Patent Office on Feb. 24, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A transistor for driving a display comprising:
a gate electrode;
a semiconductor layer facing the gate electrode with an insulating layer in between;
a pair of source-drain electrodes electrically connected to the semiconductor layer; and
a contact layer provided in a moving path of carriers between each of the pair of source-drain electrodes and the semiconductor layer, the contact layer having end surfaces covered with the source-drain electrode
wherein the contact layer is in a discontinuous state having a plurality of gaps,
wherein the contact layer extends on both sides of the semiconductor layer through end surfaces of the semiconductor layer.

2. The transistor according to claim 1, wherein the contact layer is provided between the semiconductor layer and each of the pair of source-drain electrodes.

3. The transistor according to claim 1, wherein
the contact layer includes a pair of first contact layer and second contact layer facing each other, the first contact layer and the second contact layer being disposed between the semiconductor layer and each of the pair of source-drain electrodes, and
a surface of the first contact layer and a surface of the second contact layer that face each other are also covered with the source-drain electrodes.

4. The transistor according to claim 1, wherein
the contact layer is provided on the semiconductor layer, and
the pair of the source-drain electrodes is in contact with the insulating layer.

5. The transistor according to claim 1, wherein the contact layer in the discontinuous state is formed by completion of vacuum film formation before the contact layer is developed to a continuous film.

6. The transistor according to claim 1, wherein the contact layer is a film.

* * * * *